US010510976B2

(12) United States Patent
Huang et al.

(10) Patent No.: US 10,510,976 B2
(45) Date of Patent: Dec. 17, 2019

(54) LIGHT-EMITTING APPARATUS

(71) Applicants:Industrial Technology Research Institute, Hsinchu (TW); Intellectual Property Innovation Corporation, Hsinchu (TW)

(72) Inventors: Yi-Hsiang Huang, Changhua County (TW); Yu-Tang Tsai, New Taipei (TW); Kuan-Ting Chen, Yunlin County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/826,709

(22) Filed: Nov. 30, 2017

(65) Prior Publication Data

US 2018/0151826 A1  May 31, 2018

Related U.S. Application Data

(60) Provisional application No. 62/427,820, filed on Nov. 30, 2016.

(30) Foreign Application Priority Data

Oct. 18, 2017  (TW) .............................. 106135576 A

(51) Int. Cl.
*H01L 51/50* (2006.01)
*H01L 51/52* (2006.01)

(52) U.S. Cl.
CPC ........ *H01L 51/5092* (2013.01); *H01L 51/508* (2013.01); *H01L 51/5064* (2013.01); *H01L 51/5203* (2013.01); *H01L 51/5262* (2013.01)

(58) Field of Classification Search
None
See application file for complete search history.

(56) References Cited

U.S. PATENT DOCUMENTS 8,253,692 B2  8/2012  Lai
9,075,172 B2  7/2015  Koh et al.
(Continued)

FOREIGN PATENT DOCUMENTS

CN  1690797  11/2005
CN  1823430  8/2006
(Continued)

OTHER PUBLICATIONS

"Office Action of Taiwan Counterpart Application," dated Dec. 20, 2017, p. 1-p. 9.
(Continued)

*Primary Examiner* — Walter H Swanson
*Assistant Examiner* — Kien C Ly
(74) *Attorney, Agent, or Firm* — JCIPRNET

(57) ABSTRACT

A light-emitting apparatus including a light-emitting device, a light-guiding structure and a light output structure is provided. The light-emitting device includes a light-emitting layer. The light-guiding structure is configured to guide light emitted from the light-emitting layer. The light-guiding structure is disposed beside the light-emitting device and a refractive index of the light-guiding structure is greater than or equal to an average refractive index of the light-emitting device. The light output structure is configured to receive the light guided by the light-guiding structure to output the light out of the light-emitting apparatus.

20 Claims, 22 Drawing Sheets

(56) References Cited

U.S. PATENT DOCUMENTS

| | | | |
|---|---|---|---|
| 9,367,162 | B2 | 6/2016 | Lee |
| 9,551,913 | B2 | 1/2017 | Kim et al. |
| 9,595,573 | B2 | 3/2017 | Adachi et al. |
| 9,620,740 | B2 | 4/2017 | Yamae et al. |
| 2005/0243023 | A1 | 11/2005 | Reddy et al. |
| 2007/0269917 | A1* | 11/2007 | Hubert ................ H01L 27/3246 438/29 |
| 2014/0119052 | A1 | 5/2014 | Hayama |
| 2014/0139493 | A1 | 5/2014 | King et al. |
| 2015/0370124 | A1 | 12/2015 | Han |
| 2016/0042702 | A1 | 2/2016 | Hirakata et al. |
| 2016/0172627 | A1 | 6/2016 | Park et al. |
| 2016/0205213 | A1 | 7/2016 | Kolam et al. |
| 2017/0125740 | A1* | 5/2017 | Lee ....................... H01L 27/322 |

FOREIGN PATENT DOCUMENTS

| | | |
|---|---|---|
| CN | 102033646 | 4/2011 |
| CN | 102667550 | 9/2012 |
| CN | 104750285 | 7/2015 |
| CN | 105319641 | 2/2016 |
| CN | 105759336 | 7/2016 |
| CN | 106033765 | 10/2016 |
| CN | 106094315 | 11/2016 |
| JP | 2007232882 | 9/2007 |
| TW | 200709472 | 3/2007 |
| TW | 201129833 | 9/2011 |
| TW | 201317856 | 5/2013 |
| TW | M500997 | 5/2015 |
| TW | M508682 | 9/2015 |
| TW | 201604602 | 2/2016 |
| TW | 201610961 | 3/2016 |
| WO | 2016162778 | 10/2016 |

OTHER PUBLICATIONS

"Office Action of Taiwan Related Application, application No. 106126809," dated Jun. 19, 2018, pp. 1-6.

"Fabry-Pérot interferometer," Wikipedia pages, Retrieved on Nov. 7, 2017, available at https://en.wikipedia.org/wiki/Fabry%E2%80%93P%C3%A9rot_interferometer; https://zh.wikipedia.org/wiki/%E6%B3%95%E5%B8%83%E9%87%8C%EF%BC%8D%E7%8F%80%E7%BD%97%E5%B9%B2%E6%B6%89%E4%BB%AA.

Chen, Jin-Xin, et al., "White Light OLED Illumination," Publisher: Wu-nan, ISBN: 9789571157924, Chapter 9: Optics and Outcoupling of Organic Light Emitting Device, 9.2.1 Fabry-Perot Resonance Cavity Theory, Publication date: Oct. 21, 2009, pp. 232-233, with English translation thereof.

"Office Action of China Related Application No. 201710929100.6", dated Aug. 1, 2019, pp. 1-11.

"Office Action of China Counterpart Application," dated Mar. 8, 2019, p. 1-p. 6.

* cited by examiner

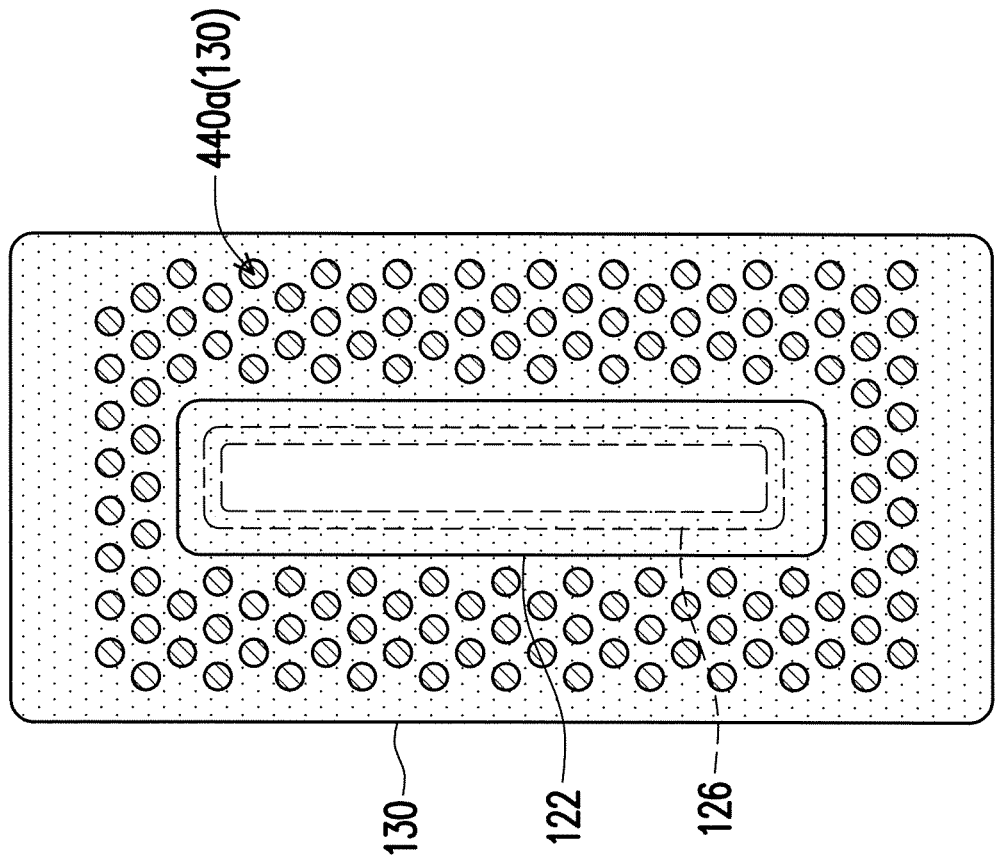
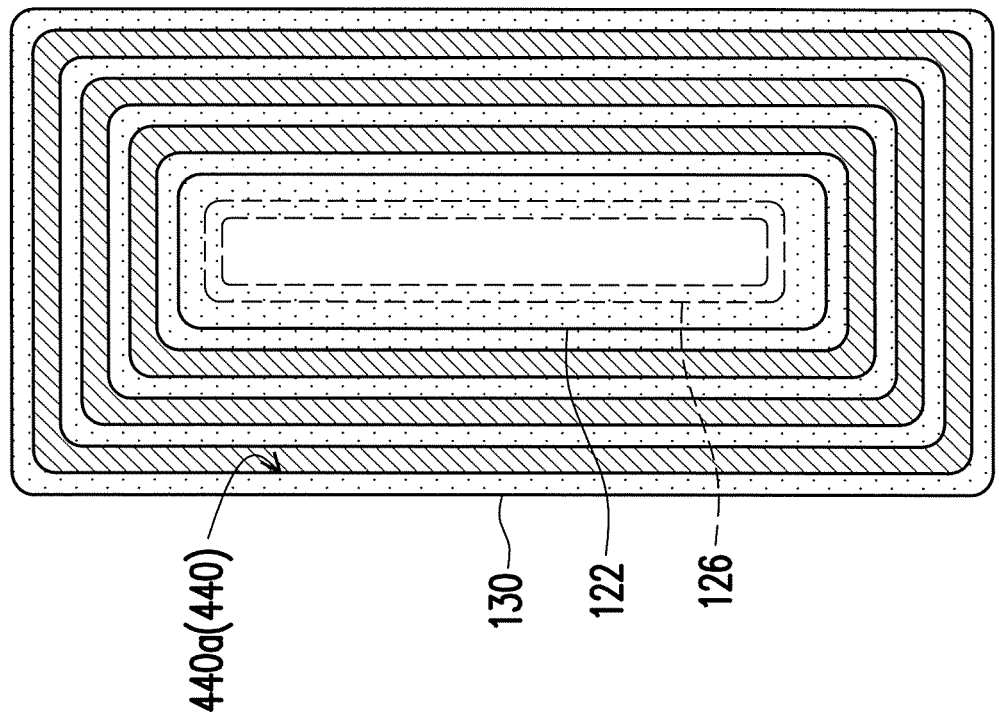

LIGHT-EMITTING APPARATUS

CROSS-REFERENCE TO RELATED APPLICATION

This application claims the priority benefits of U.S. provisional application Ser. No. 62/427,820, filed on Nov. 30, 2016 and Taiwan application serial no. 106135576, filed on Oct. 18, 2017. The entirety of each of the above-mentioned patent applications is hereby incorporated by reference herein and made a part of this specification.

TECHNICAL FIELD

The technical field relates to a light-emitting apparatus.

BACKGROUND

A transparent display refers to a display that allows light to transmit through to a certain extent. Hence, the background on the rear side of a transparent display is clearly viewable when a user is viewing the display. Owing to the property, transparent displays are applicable in our daily lives to facilitate information propagation. For example, transparent displays are applicable in smart windows, advertisement bulletins, vehicle mount displays, and the like.

In order to pursue high transparency, a transparent oxide electrode is disposed in a transparent light-emitting apparatus in the transparent display to facilitate the transparency. However, since the transparent oxide electrode has a higher refractive index, waveguide may be formed easily in the transparent light-emitting apparatus, resulting in a great amount of energy limited in a waveguide mode and thus making the energy unable to be utilized effectively. Hence, the brightness of the transparent light-emitting apparatus is highly reduced.

SUMMARY

An embodiment of the disclosure provides a light-emitting apparatus including a light-emitting device, a light-guiding structure, and a light output structure. The light-emitting device includes a light-emitting layer. The light-guiding structure is configured to guide light emitted from the light-emitting layer. The light-guiding structure is disposed beside the light-emitting device and a refractive index of the light-guiding structure is greater than or equal to an average refractive index of the light-emitting device. The light output structure is configured to receive the light guided by the light-guiding structure to output the light out of the light-emitting apparatus.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 6A is a schematic top view illustrating an aspect of the embodiment shown in FIG. 5.

FIG. 6B is a schematic top view illustrating another aspect of the embodiment shown in FIG. 5.

DETAILED DESCRIPTION OF DISCLOSED EMBODIMENTS

Figure 1:
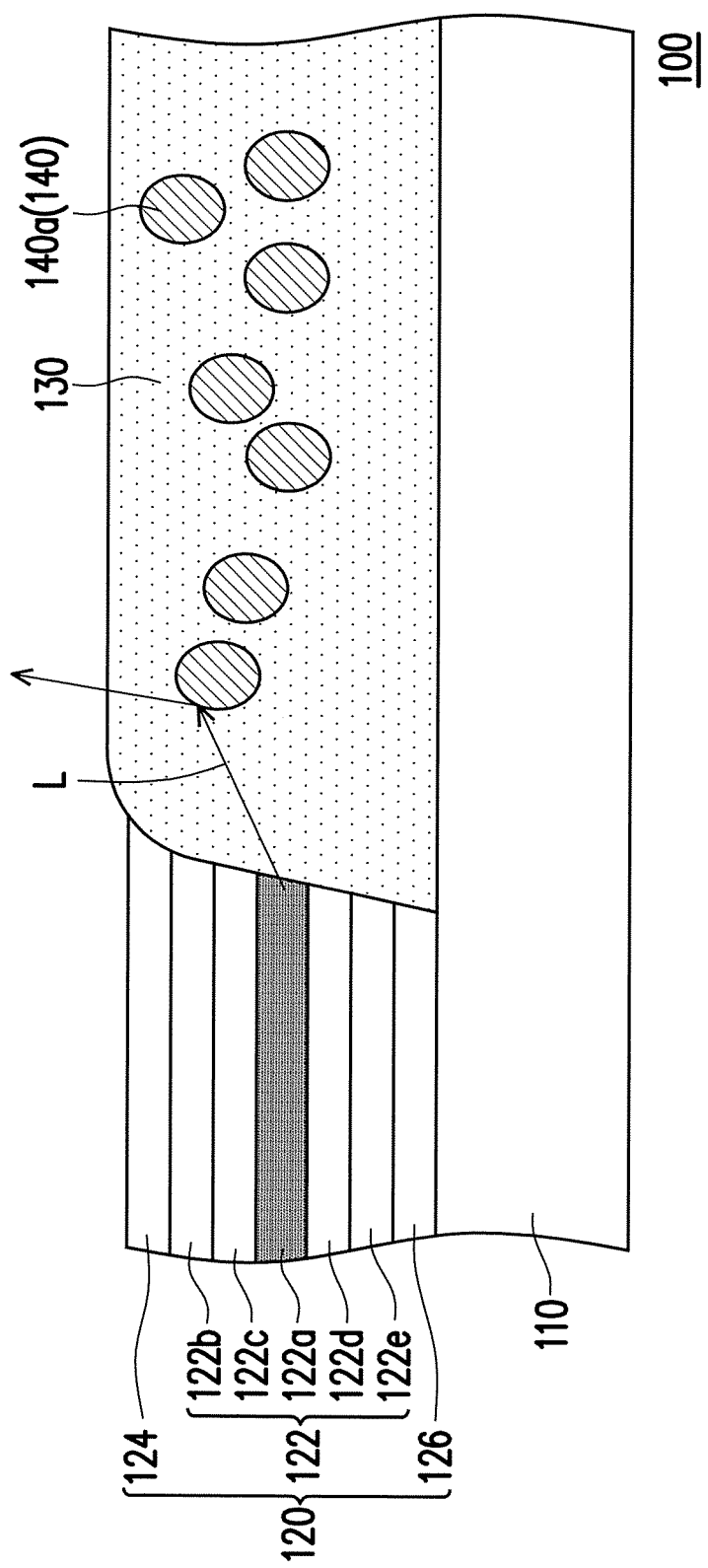
FIG. 1 is a schematic cross-sectional view illustrating a light-emitting apparatus according to an embodiment of the disclosure.

FIG. 1 is a schematic cross-sectional view illustrating a light-emitting apparatus according to an embodiment of the disclosure. Referring to FIG. 1, a light-emitting apparatus 100 in this embodiment includes a light-emitting device 120, a light-guiding structure 130, and a light output structure 140. The light-emitting device 120 includes a light-emitting layer 122a. The light-guiding structure 130 is configured to guide light L emitted from the light-emitting layer 122a. The light-guiding structure 130 is disposed beside the light-emitting device 120 and a refractive index of the light-guiding structure 130 is greater than or equal to an average refractive index of the light-emitting device 120. The light output structure 140 is configured to receive the light L guided by the light-guiding structure 130 to output the light L out of the light-emitting apparatus 100. In the embodiment, the refractive index of the light-guiding structure 130 is greater than or equal to 1.6, and is less than or equal to 2.5. Nevertheless, the disclosure is not limited thereto. For example, the light-guiding structure 130 may be made of an inorganic material, including silicon oxide ($SiO_x$), silicon nitride ($SiN_x$), zirconium oxide ($ZrO_x$), aluminum oxide ($Al_xO_y$), or hafnium oxide ($HfO_x$), wherein x and y may be arbitrary real numbers greater than 0. The light-guiding structure 130 may be made of an organic material, including an organic polymer material, a curable compound, or the like (e.g., a transparent photoresist material, a resin, an acrylic resin, or the like). In the embodiment, the light output structure 140 is disposed in the light-guiding structure 130. In addition, the light output structure 140 includes a plurality of scattering particles 140a whose dimensions are close to the wavelength of the light L to alter a traveling path of the light L after the light L is incident on the scattering particles 140a. As an example, the scattering particles 140a may be quantum dots, phosphors, or silver particles whose radius is about 10 nanometers. Besides, the scattering particles 140a may be in an arbitrary shape.

In the embodiment, the light-emitting apparatus 100 further includes a substrate 110, and the light-emitting device 120 includes a light-emitting stacked structure 122, a first electrode 124, and a second electrode 126. The first electrode 124 is disposed on the light-emitting stacked structure 122, and the second electrode 126 is disposed between the light-emitting stacked structure 122 and the substrate 110. The light-emitting stacked structure 122 includes an electron injection layer 122b, an electron transparent layer 122c, the light-emitting layer 122a, a hole transport layer 122d, and a hole injection layer 122e sequentially stacked in a top-down manner on the second electrode 126. The first electrode 124 is electrically connected to the light-emitting layer 122a through the electron injection layer 122b and the electron transport layer 122c, and the second electrode 126 is electrically connected to the light-emitting layer 122a through the hole transport layer 122d and the hole injection layer 122e. In other embodiments not shown herein, it is also viable to sequentially stack the hole injection layer, the hole transport layer, the light-emitting layer, the electron transport layer, and the electron injection layer on the second electrode in a top-down manner, the first electrode is electrically connected to the light-emitting layer through the hole transport layer and the hole injection layer, and the second electrode is electrically connected to the light-emitting layer through the electron injection layer and the electron transport layer. In the embodiment, the light-emitting device 120 is an organic light-emitting diode (OLED). In other embodiments, the light-emitting device 120 may also be a light-emitting diode (LED), a micro light-emitting diode (micro LED), or a laser diode.

When the first electrode 124 and the second electrode 126 are made of transparent material, the average refractive index of the light emitting device 120 is an average refractive index of the first electrode 124, the second electrode 126, the electron injection layer 122b, the electron transport layer 122c, the light-emitting layer 122a, the hole transport layer 122d, and the hole injection layer 122e. When the first electrode 124 and the second electrode 126 are made of metal or material not pervious to light, the average refractive index of the light-emitting device 120 is an average refractive index of the electron injection layer 122b, the electron transport layer 122c, the light-emitting layer 122a, the hole transport layer 122d, and the hole injection layer 122e. When one of the first electrode 124 and the second electrode 126 is made of metal or material not pervious to light, and the other of the first electrode 124 and the second electrode 126 is made of transparent material, the average refractive index of the light-emitting device 120 is an average refractive index of the transparent material electrode of the first electrode 124 and the second electrode 126, the electron injection layer 122b, the electron transport layer 122c, the light-emitting layer 122a, the hole transport layer 122d, and the hole injection layer 122e. In other words, when at least one of the first electrode 124 and the second electrode 126 is made of metal or material not pervious to light, the average refractive index of the light-emitting device 120 is calculated without the refractive index of the electrode made of metal or material not pervious to light.

Figure 2:
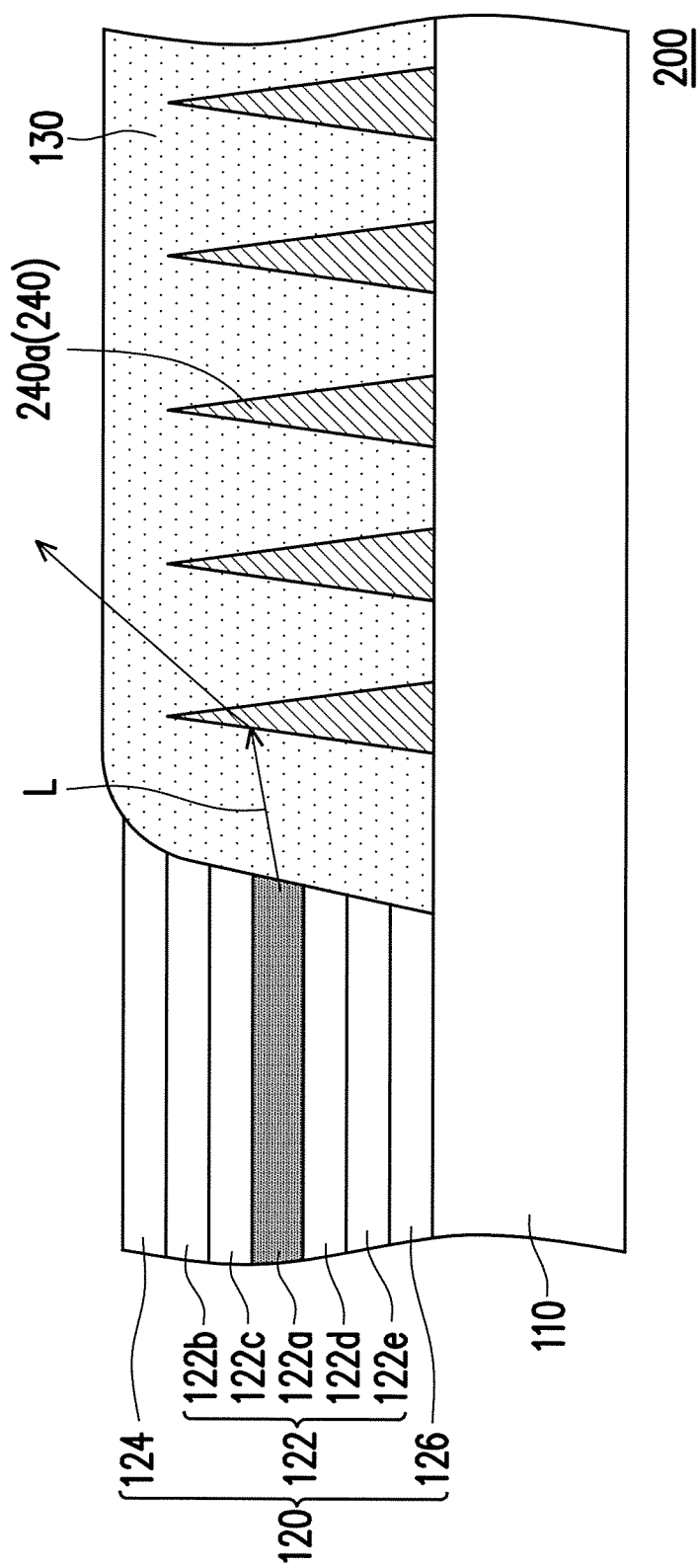
FIG. 2 is a schematic cross-sectional view illustrating a light-emitting apparatus according to an embodiment of the disclosure.

FIG. 2 is a schematic cross-sectional view illustrating a light-emitting apparatus according to an embodiment of the disclosure. Referring to FIG. 2, a light-emitting apparatus 200 of the embodiment is substantially similar to the light-emitting apparatus 100, and a main difference is that a light output structure 240 of the light-emitting apparatus 200 includes a plurality of refraction structures 240a. The light L is output out of the light-emitting apparatus 200 after being emitted to and deflected by the refraction structures 240a. In the embodiment, the refraction structures 240a may include air or a material whose refractive index is lower than the refractive index of the light-guiding structure 130. In addition, the refraction structures 240a may be in a triangular shape, a trapezoid shape, or other arbitrary shapes. As an example, the refractive index of the refraction structures 240a is greater than or equal to 1, and is less than or equal to 1.5. Nevertheless, the disclosure is not limited thereto.

Figure 3A:
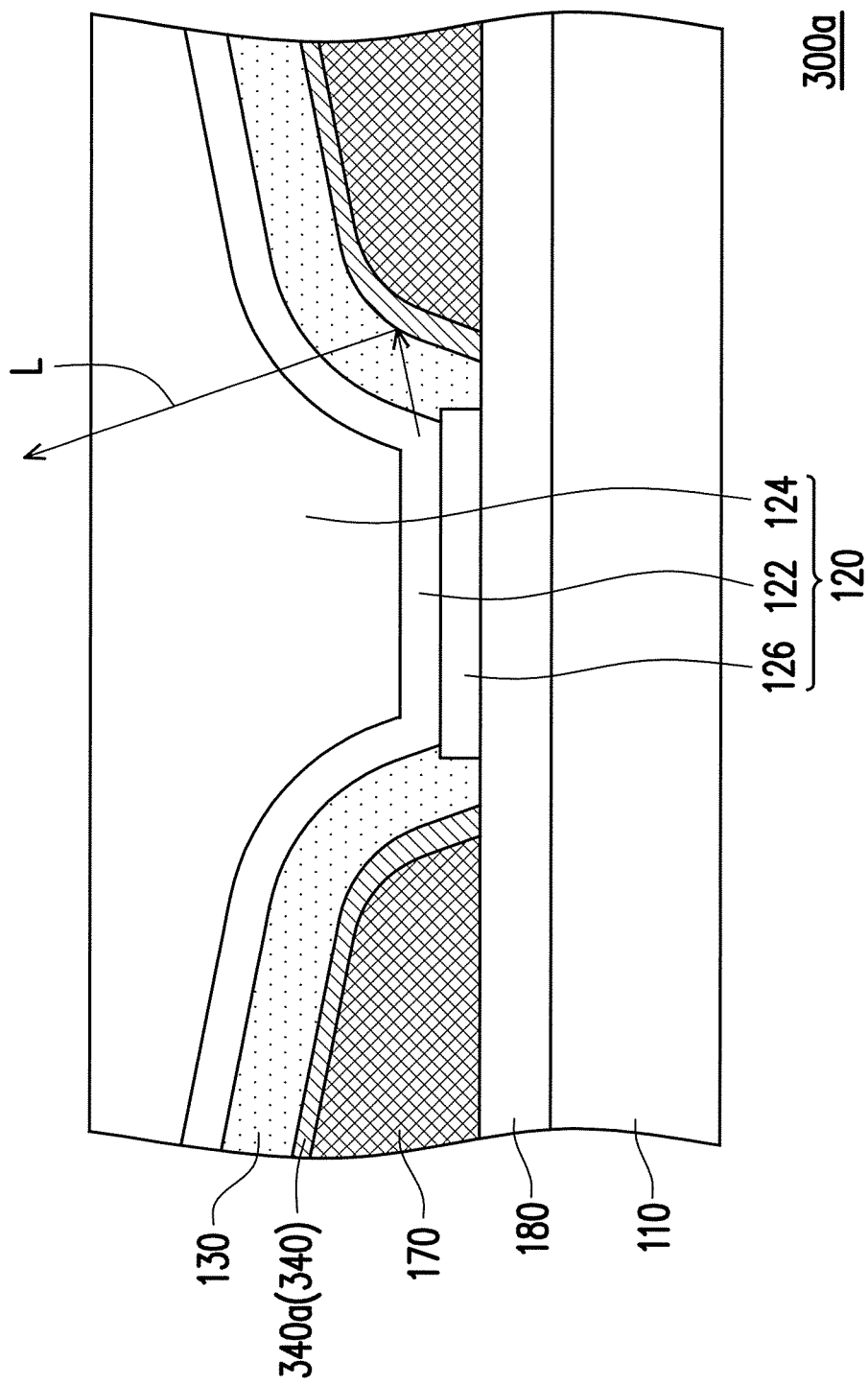
FIG. 3A is a schematic cross-sectional view illustrating a light-emitting apparatus according to an embodiment of the disclosure.

FIG. 3A is a schematic cross-sectional view illustrating a light-emitting apparatus according to an embodiment of the disclosure. For the ease of illustration, only one layer of the light-emitting stacked structure 122 is shown in FIG. 3A and the subsequent drawings to represent the electron injection layer 122b, the electron transport layer 122c, and light-emitting layer 122a, the hole transport layer 122d, and the hole injection layer 122e without illustrating each of the aforementioned layers. Besides, like or similar components are referred to by like or similar reference symbols, and the descriptions of like or similar components may be referred to the foregoing embodiment and are thus not repeated in the following. Referring to FIG. 3A, a light output structure 340 of a light-emitting apparatus 300a of the embodiment includes a reflective structure 340a configured to reflect the light L out of the light-emitting apparatus 300a, and the light-guiding structure 130 is disposed between the light-emitting device 120 and the light output structure 340. In the embodiment, the reflective structure 340a may be inclined with respect to the substrate 110 to make the light L travel upward out of the light-emitting apparatus 300a. The reflective structure 340a is an metal layer not pervious to light, for example. Here, the light-guiding structure 130 is insulating to prevent the second electrode 126 from contacting the reflective structure 340a.

In the embodiment, the light-emitting apparatus 300a may further include a pixel defining layer 170 and a planar layer 180. The pixel defining layer 170 is disposed between the light-guiding structure 130 and the planar layer 180, and the planar layer 180 is disposed between the light-guiding structure 130 and the substrate 110. The material of the pixel defining layer 170 may be any insulating material, such as a photoresist.

Figure 3B:
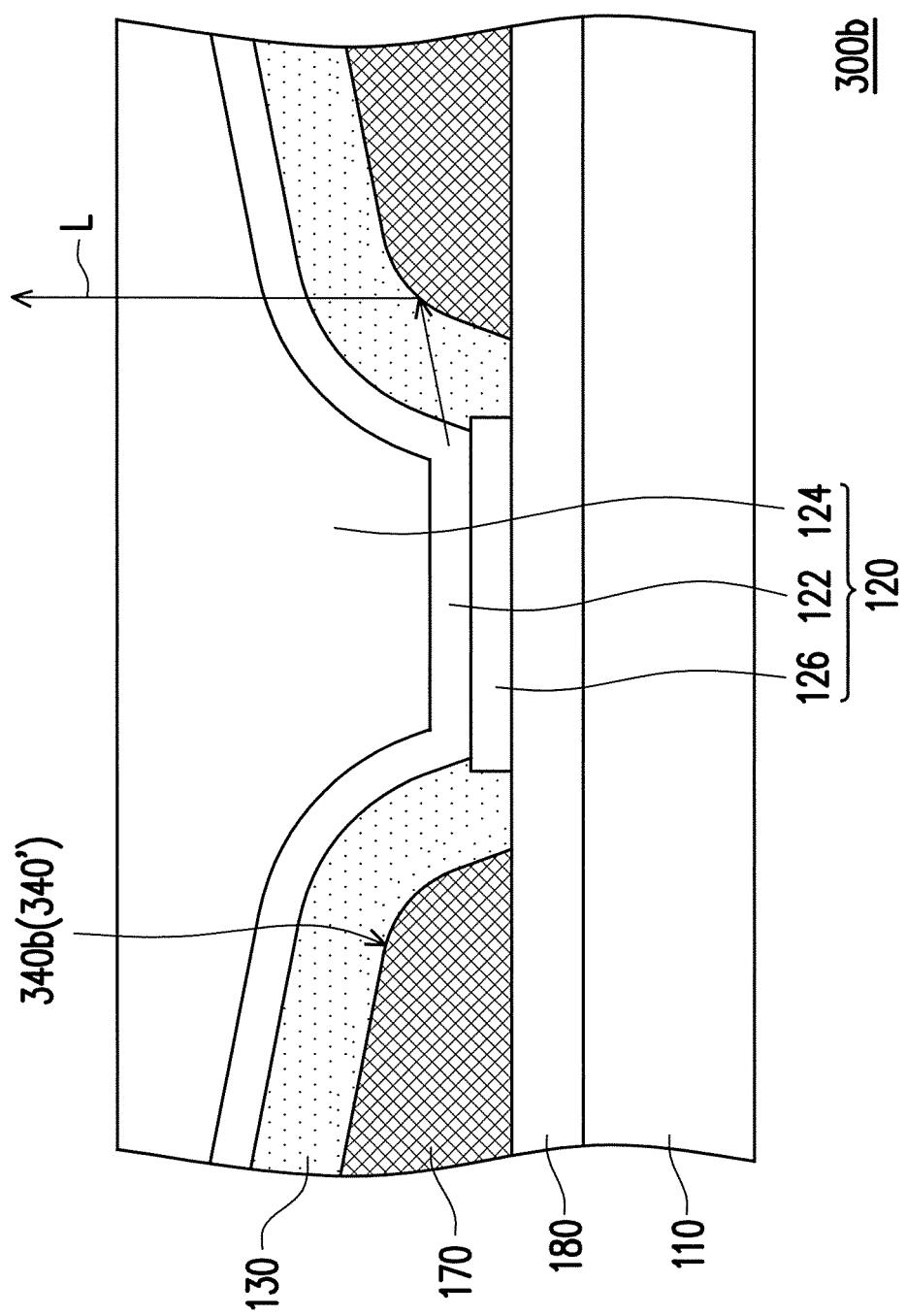
FIG. 3B is a schematic cross-sectional view illustrating a light-emitting apparatus according to an embodiment of the disclosure.

FIG. 3B is a schematic cross-sectional view illustrating a light-emitting apparatus according to another embodiment of the disclosure. Referring to FIG. 3B, a light-emitting apparatus 300b of the embodiment is substantially similar to the light-emitting apparatus 300a, and a main difference is that the light-emitting apparatus 300b does not include the reflective structure 340a as disposed in the light-emitting apparatus 300a, but directly adopts an interface 340b between the light-guiding structure 130 and the pixel defining layer 170 to be a light output structure 340'. Specifically, since the refractive index of the light-guiding structure 130 is greater than a refractive index of the pixel defining layer 170, the light L may be reflected or totally reflected when the light L from the light-guiding structure 130 is incident on the interface 340b between the light-guiding structure 130 and the pixel defining layer 170 due to the difference in refractive indices between the light-guiding structure 130 and the pixel defining layer 170. The path of the light L is consequently altered, and the light L is thus reflected out of the light-emitting apparatus 300b. In the embodiment, the difference in refractive indices between the light-guiding structure 130 and the pixel defining layer 170 is greater than or equal to 0.3, for example. Nevertheless, the disclosure is not limited thereto. In the embodiment, two layers of different materials are disposed in the light-emitting apparatus 300b to serve as the light-guiding structure 130 and the pixel defining layer 170, for example. Alternatively, the same material may be directly disposed, while an after-treatment (e.g., plasma surface treatment) is performed on the surface of the material to modify the refractive index of the surface of the material. A part treated with the after-treatment may serve as the light-guiding structure 130, and a part not treated with the after-treatment may serve as the pixel defining layer 170. Moreover, other suitable processes may still be adopted to form the light-guiding structure 130 and the pixel defining layer 170 having different refractive indices.

Figure 4B:
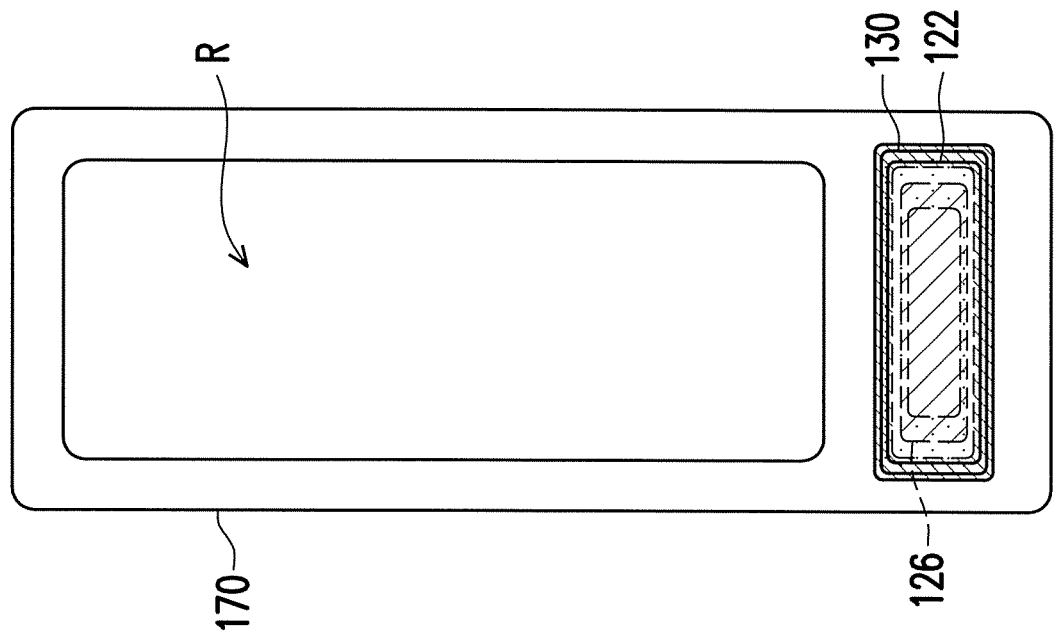
FIG. 4B is a schematic top view illustrating another aspect of the embodiment shown in FIG. 3A.
Figure 4A:
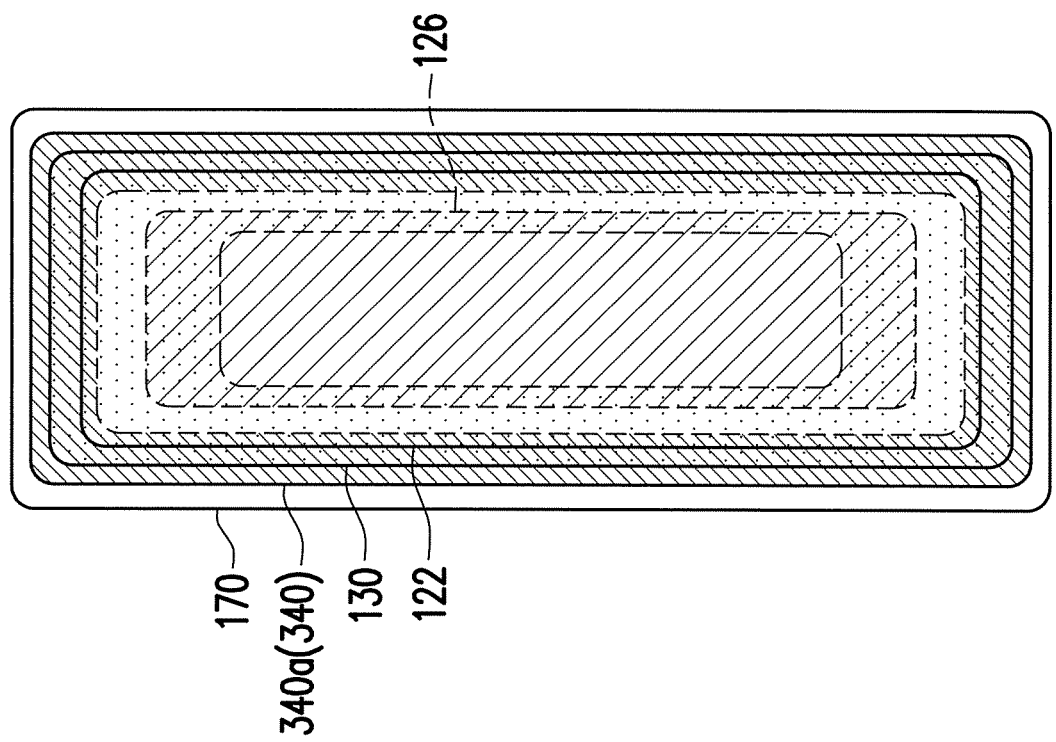
FIG. 4A is a schematic top view illustrating an aspect of the embodiment shown in FIG. 3A.

FIG. 4A is a schematic top view illustrating an aspect of the embodiment shown in FIG. 3A. FIG. 4B is a schematic top view illustrating another aspect of the embodiment shown in FIG. 3A. For the ease of illustration, FIGS. 4A and 4B omit the uppermost first electrode 124. Referring to FIGS. 4A and 4B, the light-guiding structure 130 and the light output structure 340 surround the light-emitting stacked structure 122. In addition, from the top perspective, the light-guiding structure 130 and the light output structure 340 are in a shape of a rectangular frame. Besides, the light-emitting apparatus may further include a transparent opening region R (shown in FIG. 4B) disposed beside the light-emitting stacked structure 122, the light-guiding structure 130, and the light output structure 340.

A total light output ratio of a light-emitting apparatus without the light output structure is 15.2%. If a light output gain of such total light output ratio is defined as 1, the light-emitting apparatus 100 having the scattering particles 140a as the light output structure 140 has a total light output ratio of 23.3% and a light output gain of 1.53. The light-emitting apparatus 200 having the refraction structures 240a as the light output structure 240 has a total light output ratio of 25.0% and a light output gain of 1.64. The light-emitting apparatus 300a having the reflective structure 340a as the light output structure 340 has a total light output ratio of 34.2% and a light output gain of 2.25. Accordingly, the three light output structures are capable of effectively facilitating the light output efficiency.

Figure 5:
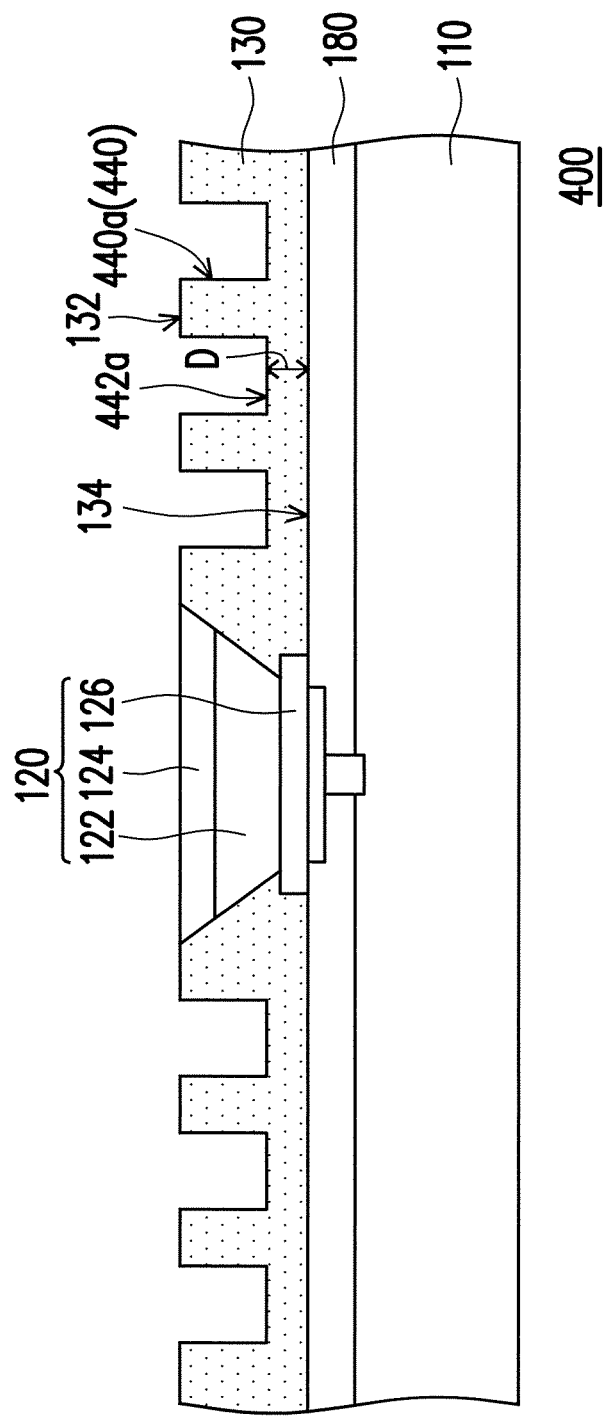
FIG. 5 is a schematic cross-sectional view illustrating a light-emitting apparatus according to an embodiment of the disclosure.

FIG. 5 is a schematic cross-sectional view illustrating a light-emitting apparatus according to an embodiment of the disclosure. Referring to FIG. 5, it should be noted that like or similar components are referred to by like or similar reference symbols, and the descriptions of like or similar components may be referred to the foregoing embodiments and are thus not repeated in the following. A light output structure 440 of a light-emitting apparatus 400 of the embodiment includes a groove 440a (a plurality of the grooves 440a are shown in FIG. 5 for an illustrative purpose) disposed in a first surface 132 of the light-guiding structure 130. A distance D between a bottom 442a of the groove 440a and a second surface 134 of the light-guiding structure 130 opposite to the first surface 132 is less than $$\frac{\lambda}{2n},$$

wherein λ represents the wavelength of the light, and n represents the refractive index of the light-guiding structure 130. When light waves are transmitted in a medium in a waveguide mode, if a thickness of the medium is less than $$\frac{\lambda}{2n},$$

the light waves are unable to sustain as standing waves in a first mode of the light waves, so energy of the first mode is destructed and guided to be output as light. In other words, since the distance D between the bottom 442a of the groove 440a and the second surface 134 of the light-guiding structure 130 is less than $$\frac{\lambda}{2n},$$

when the light waves pass through the bottom 442a of the groove 440a, some of the light waves may be guided to be output out of the light-emitting apparatus 400.

In other embodiments not shown herein, the light output structure 440 may include a lens array, a photonic crystal, or a rough surface disposed on a surface (e.g., at least one of the first surface 132 and the second surface 134) of the light-guiding structure 130.

FIG. 6A is a schematic top view illustrating an aspect of the embodiment shown in FIG. 5. FIG. 6B is a schematic top view illustrating another aspect of the embodiment shown in FIG. 5. For the ease of illustration, FIGS. 6A and 6B omit the uppermost first electrode 124. Referring to FIGS. 6A and 6B, the grooves 440a are disposed around the light-emitting stacked structure 122, and the groove 440a may be an arbitrary shape. For example, as shown in FIG. 6A, the groove 440a may be in a rectangular frame-like shape from a top perspective. As shown in FIG. 6B, the groove 440a may also be in a circular shape from a top perspective.

Figure 7:
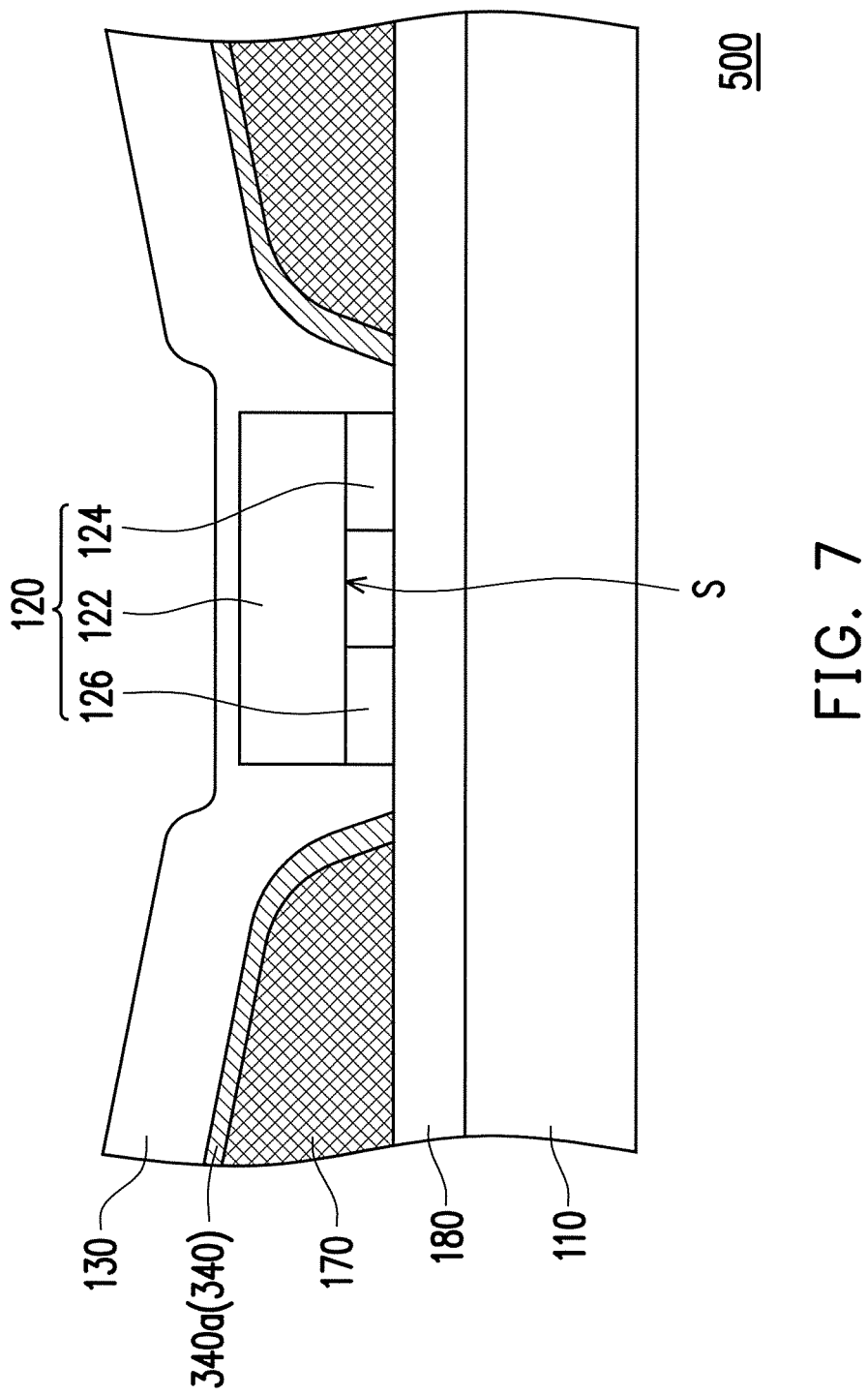
FIG. 7 is a schematic cross-sectional view illustrating a light-emitting apparatus according to an embodiment of the disclosure.

FIG. 7 is a schematic cross-sectional view illustrating a light-emitting apparatus according to an embodiment of the disclosure. Referring to FIG. 7, a light-emitting apparatus 500 of the embodiment is substantially similar to the light-emitting apparatus 300a, and a main difference is that the first electrode 124 and the second electrode 126 of the light-emitting apparatus 500 are disposed between the light-emitting stacked structure 122 and the substrate 110, and the first electrode 124 and the second electrode 126 are separated from each other to expose a portion of a surface S of the light-emitting stacked structure 122. In other words, it is viable that the first electrode 124 and the second electrode 126 of the light-emitting apparatus 500 do not completely cover the whole surface of the light-emitting stacked structure 122.

Based on the above, the light-emitting apparatus 100, the light-emitting apparatus 200, the light-emitting apparatus 300*a*, and the light-emitting apparatus 400 respectively adopt the four designs, i.e., the light output structure 140, the light output structure 240, the light output structure 340, and the light output structure 440, to output light out of the light-emitting apparatus. In the first design, the scattering particles 140*a* are disposed in the light-guiding structure 130; in the second design, the refraction structures 240*a* are disposed in the light-guiding structure 130; in the third design, the reflective structure 340*a* is disposed below the light-guiding structure 130; and in the fourth design, the grooves 440*a* are disposed on the first surface 132 of the light-guiding structure 130. The four designs are capable of facilitating the light output efficiency of the light-emitting apparatus. Nevertheless, in other embodiments, a light-emitting apparatus may also adopt any two, three, or four of the four designs, and the light output efficiency may still be facilitated.

Figure 8A:
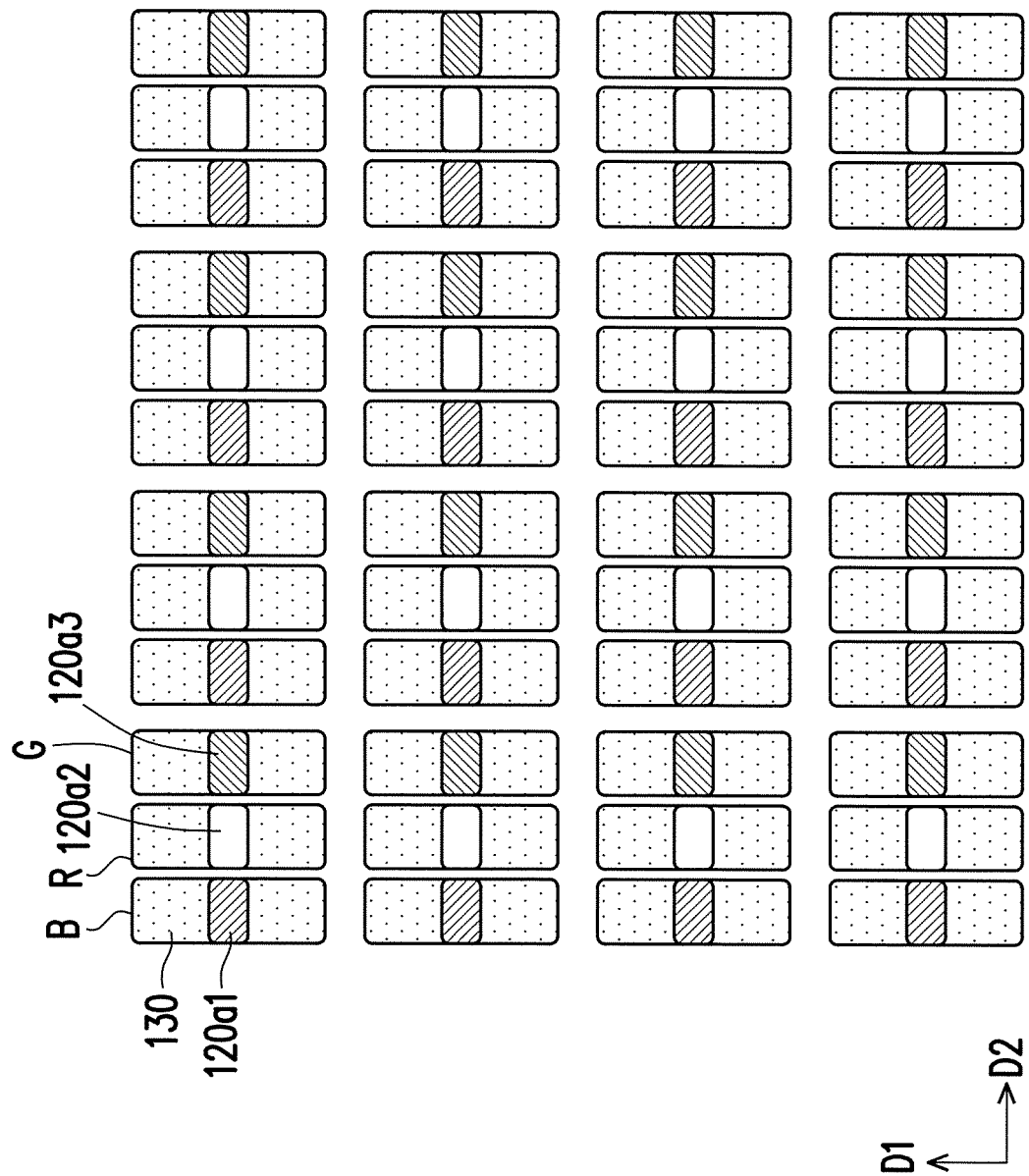
FIGS. 8A to 8E are schematic top views illustrating a pixel array formed by light-emitting apparatuses according to some embodiments of the disclosure.
Figure 8B:
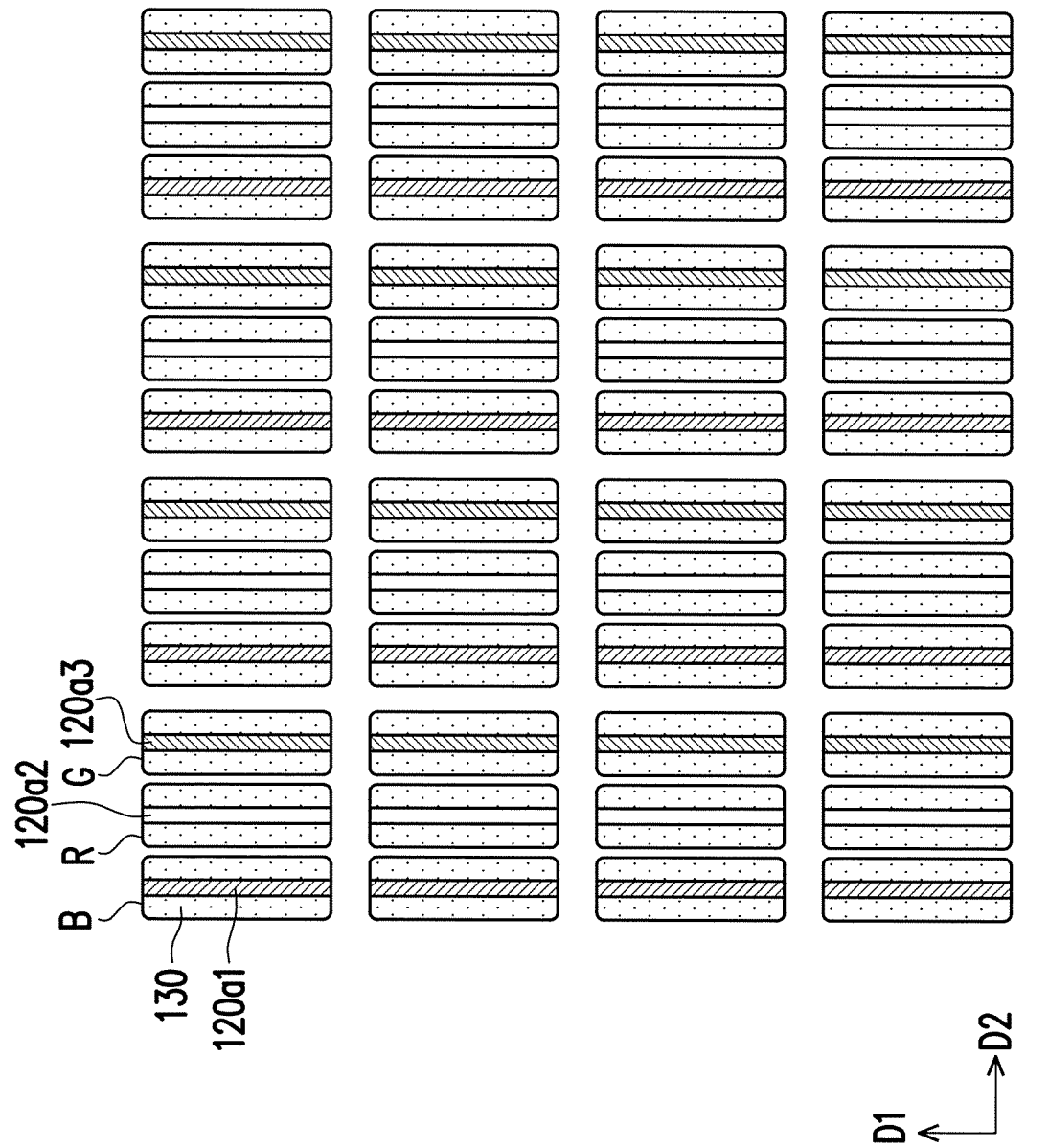
Figure 8C:
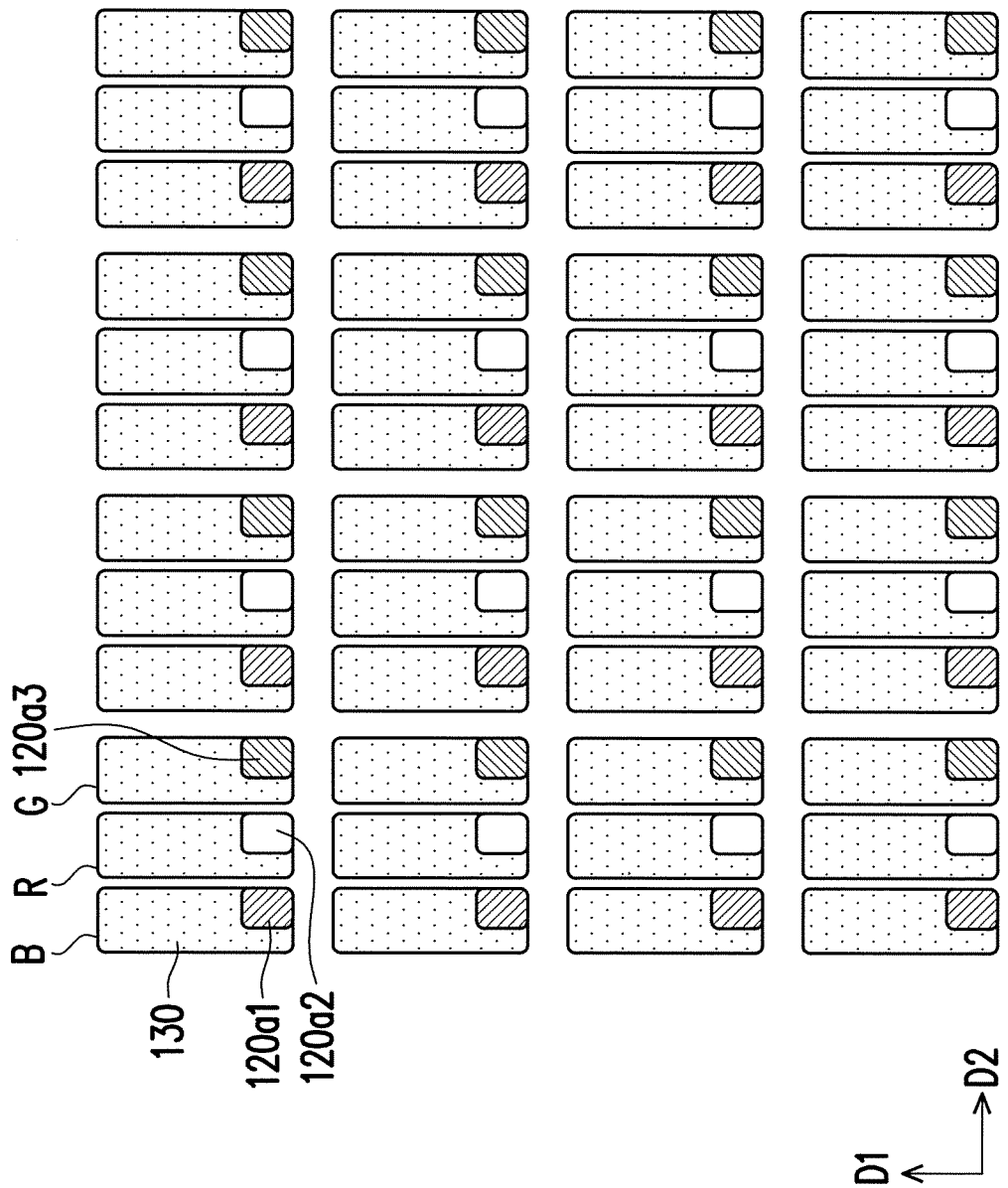

FIGS. 8A to 8E are schematic top views illustrating a pixel array formed by light-emitting apparatuses according to some embodiments of the disclosure. In the embodiments, the light-emitting apparatus may include one or more of the four light output structures. Hence, detailed descriptions in this regard will not be repeated in the following. Referring to FIGS. 8A to 8C, a first sub-pixel B includes a light-emitting device 120*a*1 and the light-guiding structure 130, a second sub-pixel R includes a light-emitting device 120*a*2 and the light-guiding structure 130, and a third sub-pixel G includes a light-emitting device 120*a*3 and the light-guiding structure 130. The first sub-pixel B, the second sub-pixel R, and the third sub-pixel G extend along a first direction D1, and the first sub-pixel B, the second sub-pixel R, and the third sub-pixel G are sequentially arranged along a second direction D2. In addition, the light-emitting device 120*a*1 of the first sub-pixel B, the light-emitting device 120*a*2 of the second sub-pixel R, and the light-emitting device 120*a*3 of the third sub-pixel G may have various arrangements with their light-guiding structures 130. For example, as shown in FIG. 8A, the light-guiding structure 130 of the first sub-pixel B is located on two sides of the light-emitting device 120*a*1 in the first direction D1, the light-guiding structure 130 of the second sub-pixel R is located on two sides of the light-emitting device 120*a*2 in the first direction D1, and the light-guiding structure 130 of the third sub-pixel G is located on two sides of the light-emitting device 120*a*3 in the first direction D1. As shown in FIG. 8B, the light-guiding structure 130 of the first sub-pixel B is located on two sides of the light-emitting device 120*a*1 in the second direction D2, the light-guiding structure 130 of the second sub-pixel R is located on two sides of the light-emitting device 120*a*2 in the second direction D2, and the light-guiding structure 130 of the third sub-pixel G is located on two sides of the light-emitting device 120*a*3 in the second direction D2. As shown in FIG. 8C, the light-emitting device 120*a*1 of the first sub-pixel B, the light-emitting device 120*a*2 of the second sub-pixel R, and the light-emitting device 120*a*3 of the third sub-pixel G may respectively be located at a corner of the first sub-pixel B, a corner of the second sub-pixel G, and a corner of the third sub-pixel G, and the respective light-guiding structures 130 of the first sub-pixel B, the second sub-pixel R, and the third sub-pixel G may be respectively located beside the light-emitting device 120*a*1, the light-emitting device 120*a*2, and the light-emitting device 120*a*3. Nevertheless, the disclosure is not limited thereto. Here, the light-emitting device 120*a*1 of the first sub-pixel B, the light-emitting device 120*a*2 of the second sub-pixel R, and the light-emitting device 120*a*3 of the third sub-pixel G may respectively emit blue light, red light, and green light.

Figure 8D:
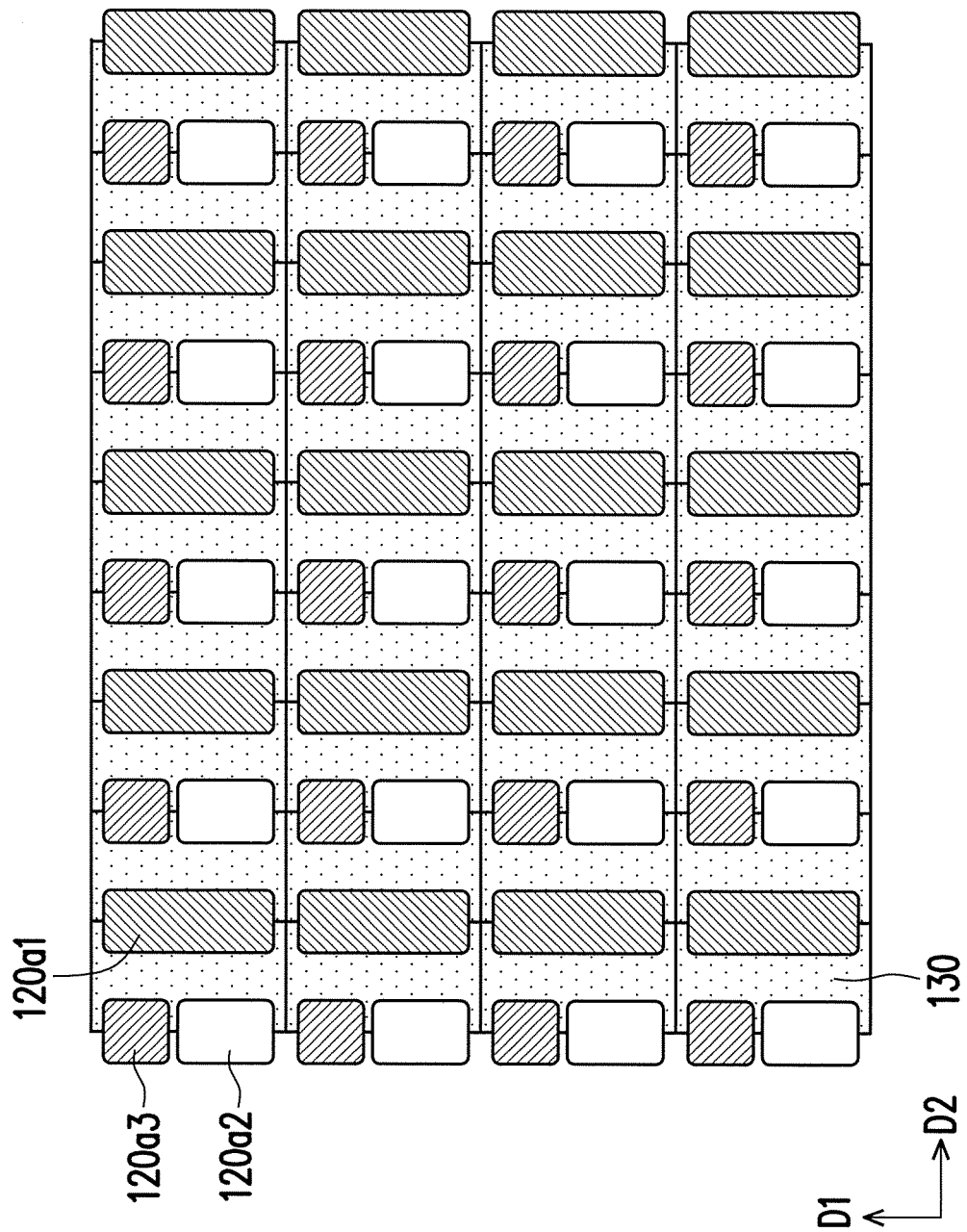
Figure 8E:
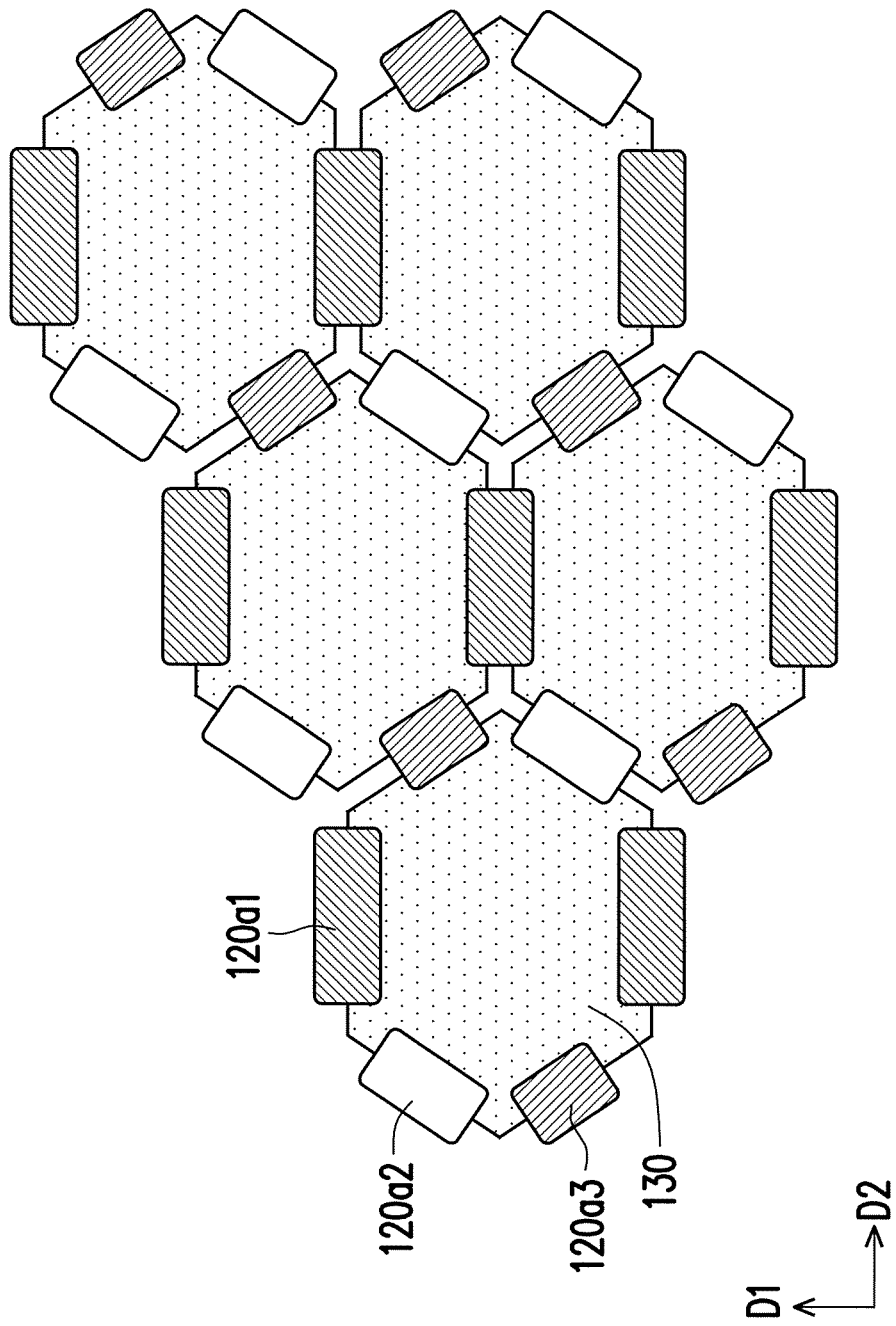

Referring to FIGS. 8D and 8E, the light-emitting device 120*a*1, the light-emitting device 120*a*2, and the light-emitting device 120*a*3 may share the light-guiding structure 130. As shown in FIG. 8D, the light-guiding structure 130 surrounds the light-emitting device 120*a*1, the light-emitting device 120*a*2, and the light-emitting device 120*a*3, the light-emitting device 120*a*2 is adjacent to the light-emitting device 120*a*3 in the first direction D1, and the light-emitting device 120*a*1 is adjacent to the light-emitting device 120*a*2 and the light-emitting device 120*a*3 in the second direction D2. In addition, the adjacent light-emitting devices 120*a*1, 120*a*2, and 120*a*3 share the light-guiding structure 130 with each other. As shown in FIG. 8E, the light-guiding structure 130 may have a profile similar to a hexagon. In addition, each of the light-emitting device 120*a*1, the light-emitting device 120*a*2, and the light-emitting device 120*a*3 is disposed on one of the six sides of the light-guiding structure 130. Moreover, the light-emitting devices 120*a*1, 120*a*2, and 120*a*3 share the same light-guiding structure 130. Moreover, the adjacent light-guiding structures 130 may share the same light-emitting device 120*a*1, the same light-emitting device 120*a*2, or the same light-emitting device 120*a*3. In the embodiment, since different light-emitting devices share the light-guiding structure 130, the color displayed in a display frame is more gentle.

Figure 9:
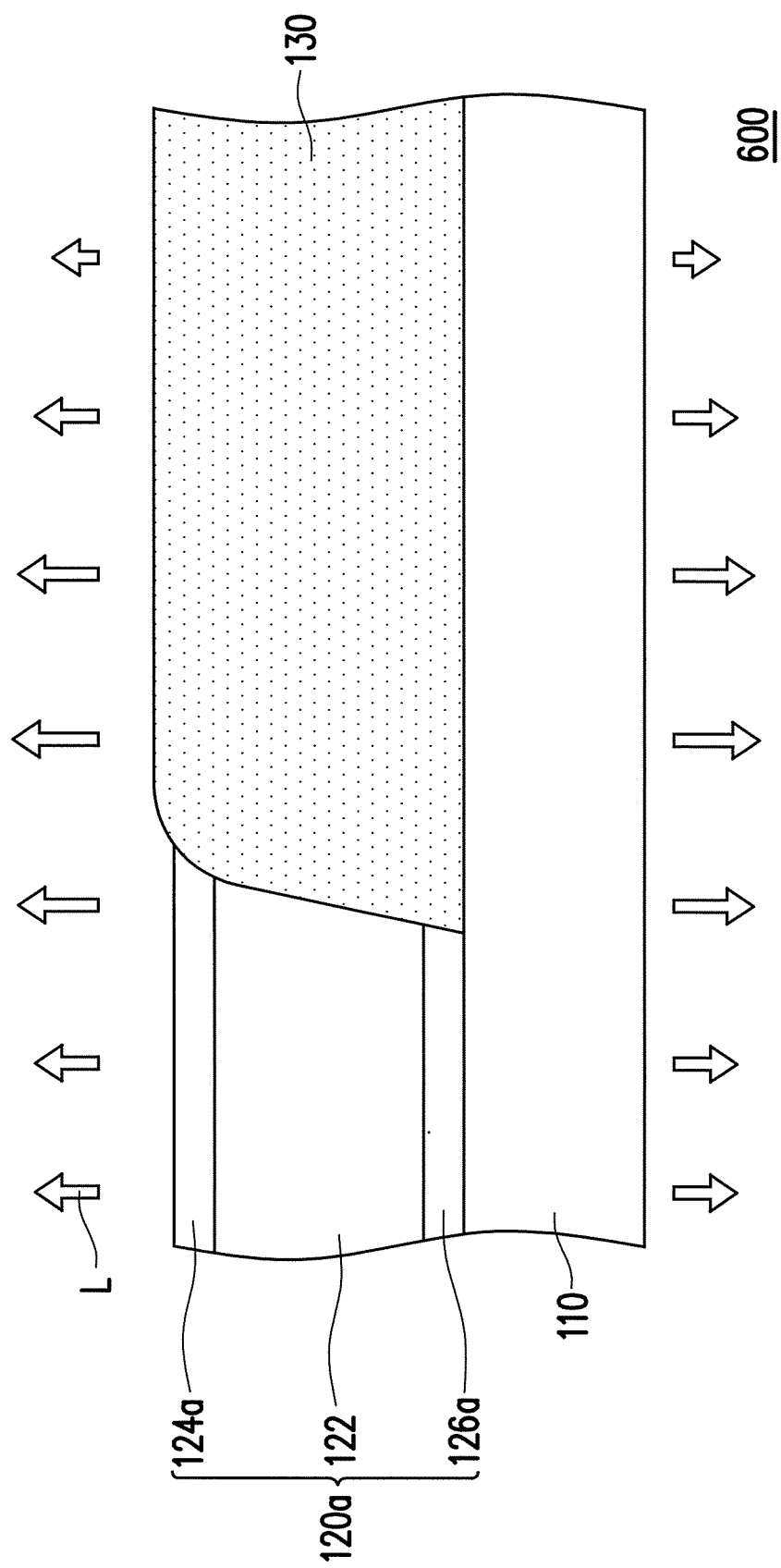
FIG. 9 is a schematic cross-sectional view illustrating a light-emitting apparatus according to an embodiment of the disclosure.

FIG. 9 is a schematic cross-sectional view illustrating a light-emitting apparatus according to an embodiment of the disclosure. Referring to FIG. 9, a light-emitting apparatus 600 of the embodiment may include one or more of the aforementioned four light output structures. Hence, detailed descriptions in this regard will not be repeated in the following. A first electrode 124*a* and a second electrode 126*a* of the light-emitting device 120*a* of the light-emitting apparatus 600 are transparent electrodes. Therefore, the light L may be emitted from two surfaces of the light-emitting apparatus 600. The material of the transparent electrode is indium tin oxide (ITO), indium zinc oxide (IZO), or other suitable transparent conductive materials, for example.

Figure 10:
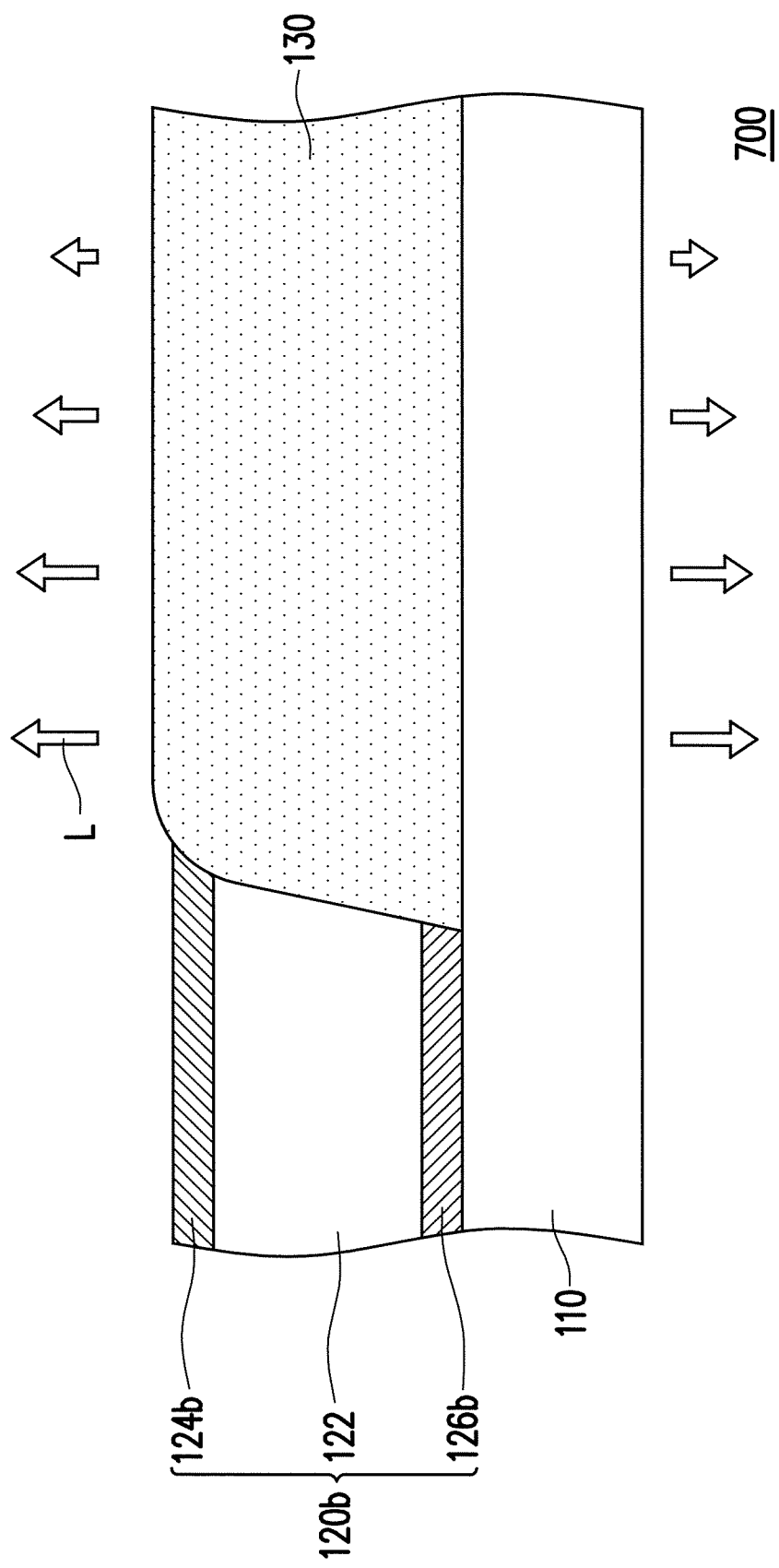
FIG. 10 is a schematic cross-sectional view illustrating a light-emitting apparatus according to an embodiment of the disclosure.

FIG. 10 is a schematic cross-sectional view illustrating a light-emitting apparatus according to an embodiment of the disclosure. Referring to FIG. 10, a light-emitting apparatus 700 of the embodiment may include one or more of the aforementioned four light output structures. Hence, detailed descriptions in this regard will not be repeated in the following. A first electrode 124*b* and a second electrode 126*b* of a light-emitting device 120*b* of the light-emitting apparatus 700 are reflective electrodes that are not pervious to light. Therefore, the light L are not emitted from the two surfaces of the light-emitting device 120*b*. The material of the reflective electrode is silver (Ag), aluminum (Al), or other suitable metal materials, for example.

Figure 11:
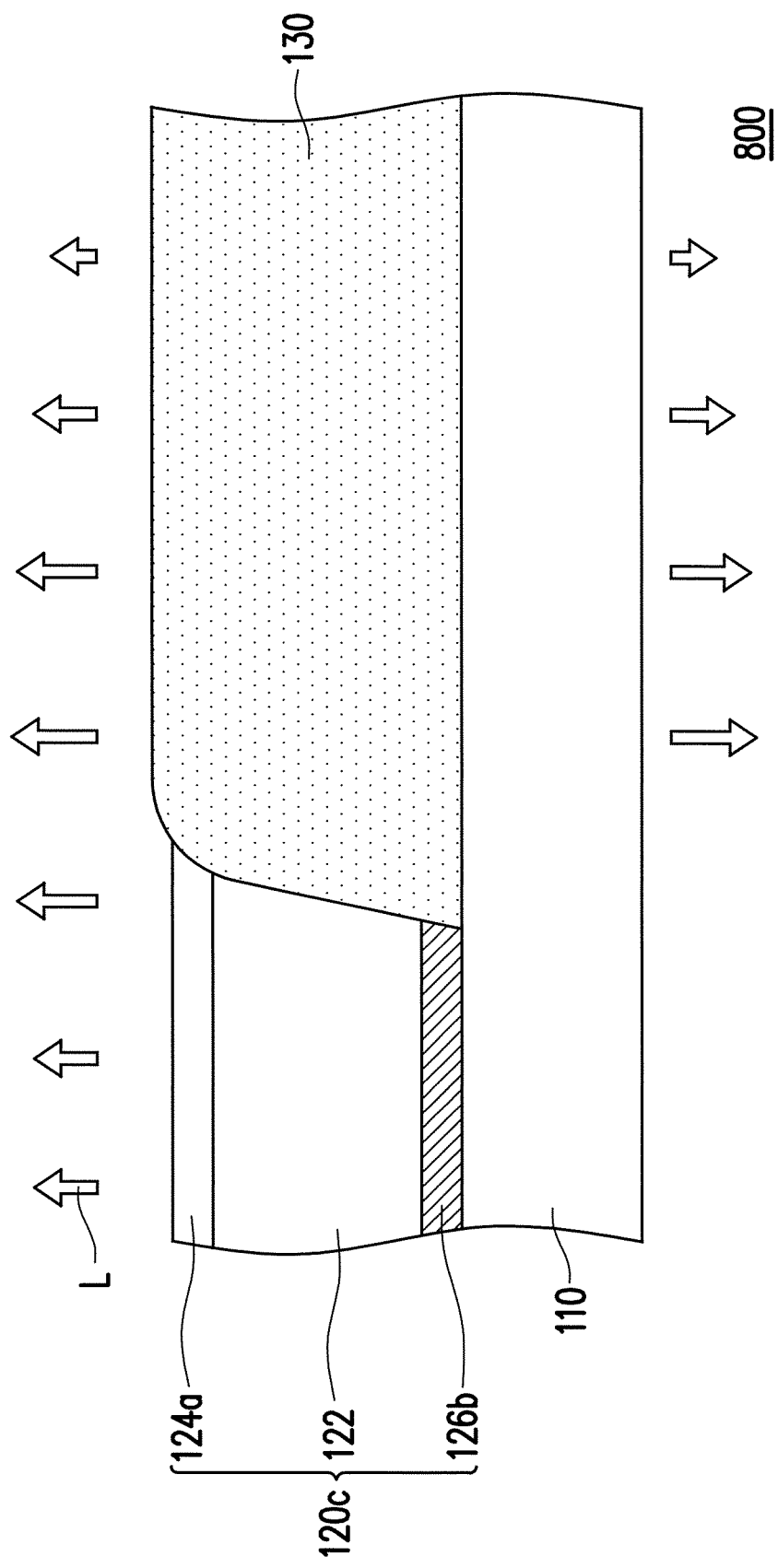
FIG. 11 is a schematic cross-sectional view illustrating a light-emitting apparatus according to an embodiment of the disclosure.

FIG. 11 is a schematic cross-sectional view illustrating a light-emitting apparatus according to an embodiment of the disclosure. Referring to FIG. 11, a light-emitting apparatus 800 of the embodiment may include one or more of the aforementioned four light output structures. Hence, detailed descriptions in this regard will not be repeated in the following. The first electrode 124a of a light-emitting device 120c of the light-emitting apparatus 800 is a transparent electrode, the second electrode 126b of the light-emitting device 120c is a reflective electrode that is not pervious to light or a reflective mirror that is not pervious to light. Accordingly, the surface of the light-emitting apparatus 800 away from the substrate 110 emits light, whereas the surface of the light-emitting apparatus 800 near the substrate 110 does not emit light.

Figure 12:
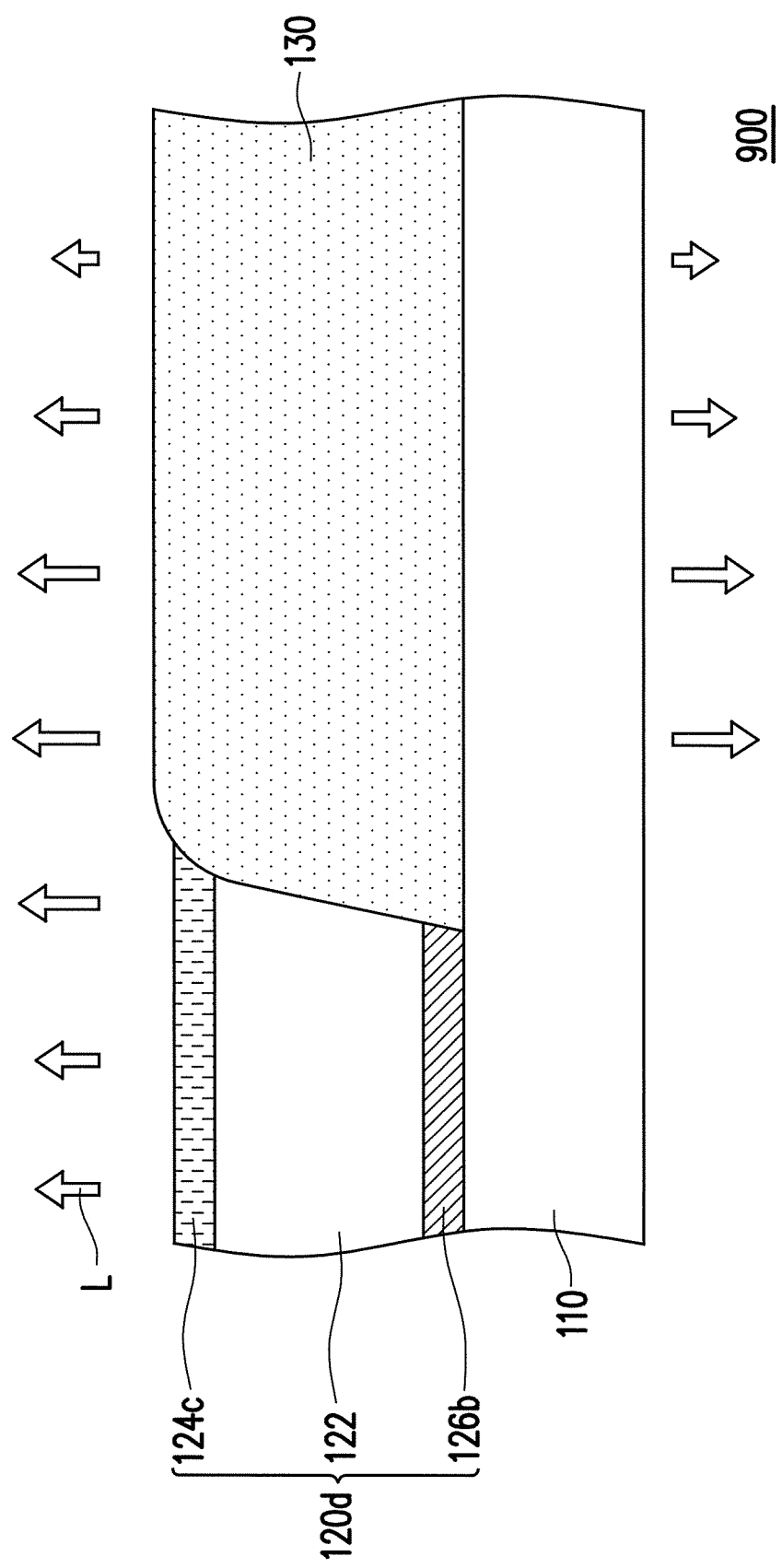
FIG. 12 is a schematic cross-sectional view illustrating a light-emitting apparatus according to an embodiment of the disclosure.

FIG. 12 is a schematic cross-sectional view illustrating a light-emitting apparatus according to an embodiment of the disclosure. Referring to FIG. 12, a light-emitting apparatus 900 of the embodiment may include one or more of the aforementioned four light output structures. Hence, detailed descriptions in this regard will not be repeated in the following. The light-emitting apparatus 900 is substantially similar to the light-emitting apparatus 800, and a main difference is that a first electrode 124c of a light-emitting device 120d of the light-emitting apparatus 900 is a semi-transparent electrode. Accordingly, the surface of the light-emitting apparatus 900 away from the substrate 110 may slightly emit light. The semi-transparent electrode is a thin metal electrode in a semi-transparent state, and the material of the semi-transparent electrode is Ag, Al, or other suitable metal materials, for example.

Figure 13:
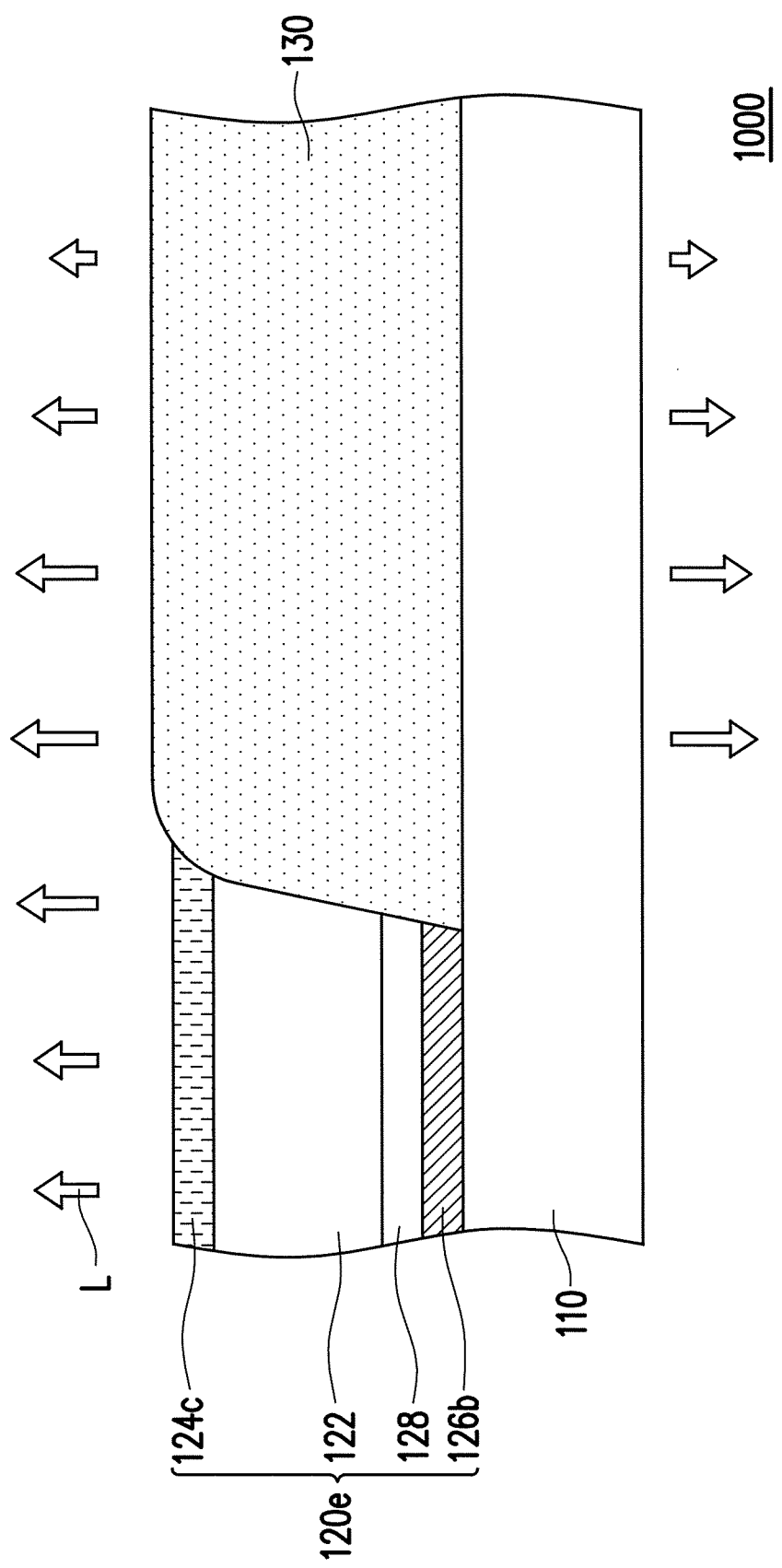
FIG. 13 is a schematic cross-sectional view illustrating a light-emitting apparatus according to an embodiment of the disclosure.

FIG. 13 is a schematic cross-sectional view illustrating a light-emitting apparatus according to an embodiment of the disclosure. Referring to FIG. 13, a light-emitting apparatus 1000 of the embodiment may include one or more of the aforementioned four light output structures. Hence, detailed descriptions in this regard will not be repeated in the following. The light-emitting apparatus 1000 is substantially similar to the light-emitting apparatus 900, and a main difference is that a light-emitting device 120e of the light-emitting apparatus 1000 further includes a low refractive index layer 128 having a refractive index lower than a refractive index of the light-emitting stacked structure 122 and being electrically conductive. The low refractive index layer 128 is disposed between the second electrode 126b and the light-emitting stacked structure 122. Since the refractive index of the low refractive index layer 128 is lower than the refractive index of the light-emitting stacked structure 122, the low refractive index layer 128 is able to reduce light waves transmitted to the second electrode 126b and absorbed by the second electrode 126b.

Figure 14:
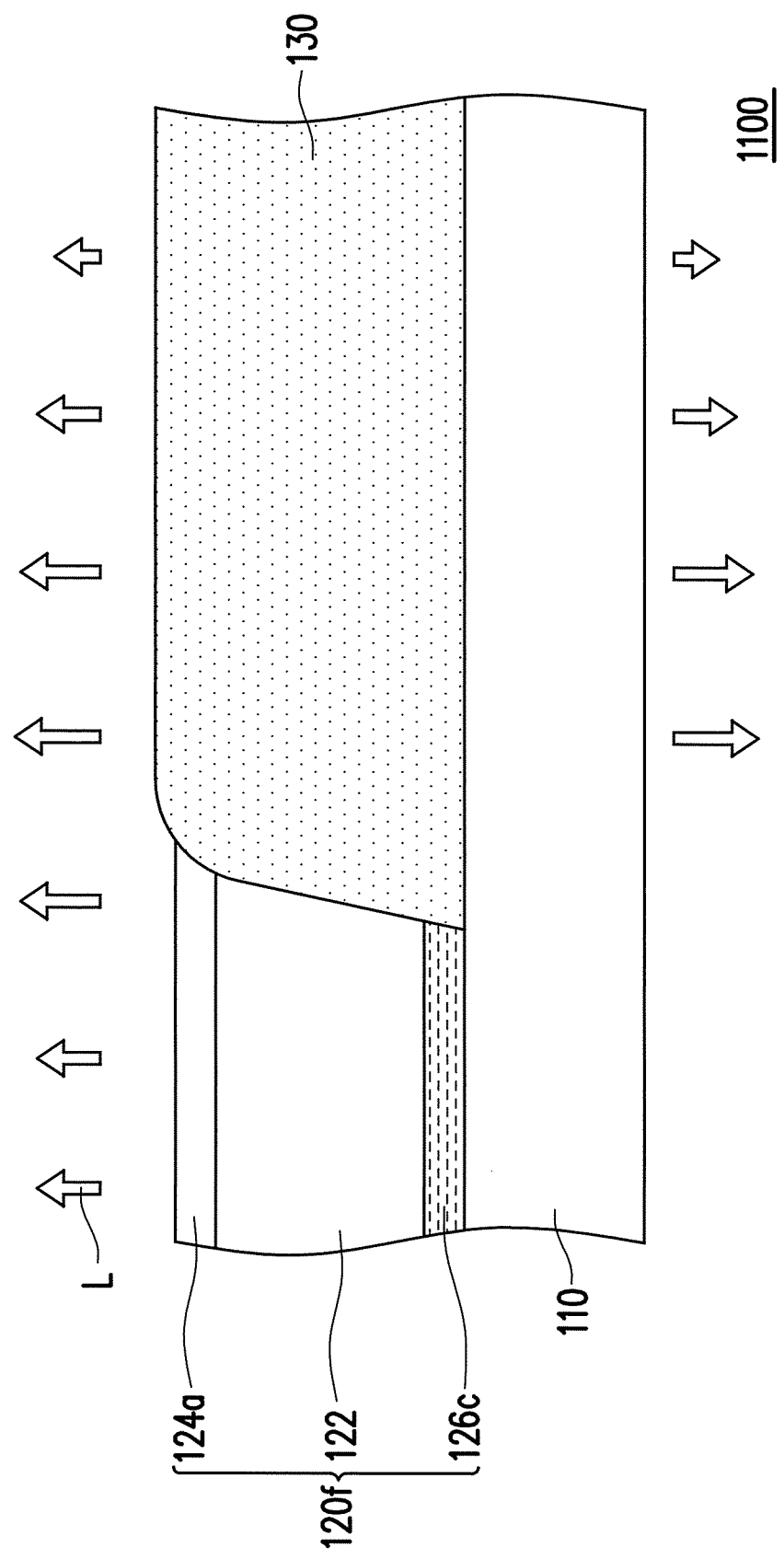
FIG. 14 is a schematic cross-sectional view illustrating a light-emitting apparatus according to an embodiment of the disclosure.

FIG. 14 is a schematic cross-sectional view illustrating a light-emitting apparatus according to an embodiment of the disclosure. Referring to FIG. 14, a light-emitting apparatus 1100 of the embodiment may include one or more of the aforementioned four light output structures. Hence, detailed descriptions in this regard will not be repeated in the following. The first electrode 124a of a light-emitting device 120f of the light-emitting apparatus 1100 is a transparent electrode, and a second electrode 126c of the light-emitting device 120f is a distributed Bragg reflector or a wavelength-selective reflector. The distributed Bragg reflector is able to effectively reduce the absorption in a surface plasmon polariton mode, making it easier to guide and output the light waves.

Figure 15:
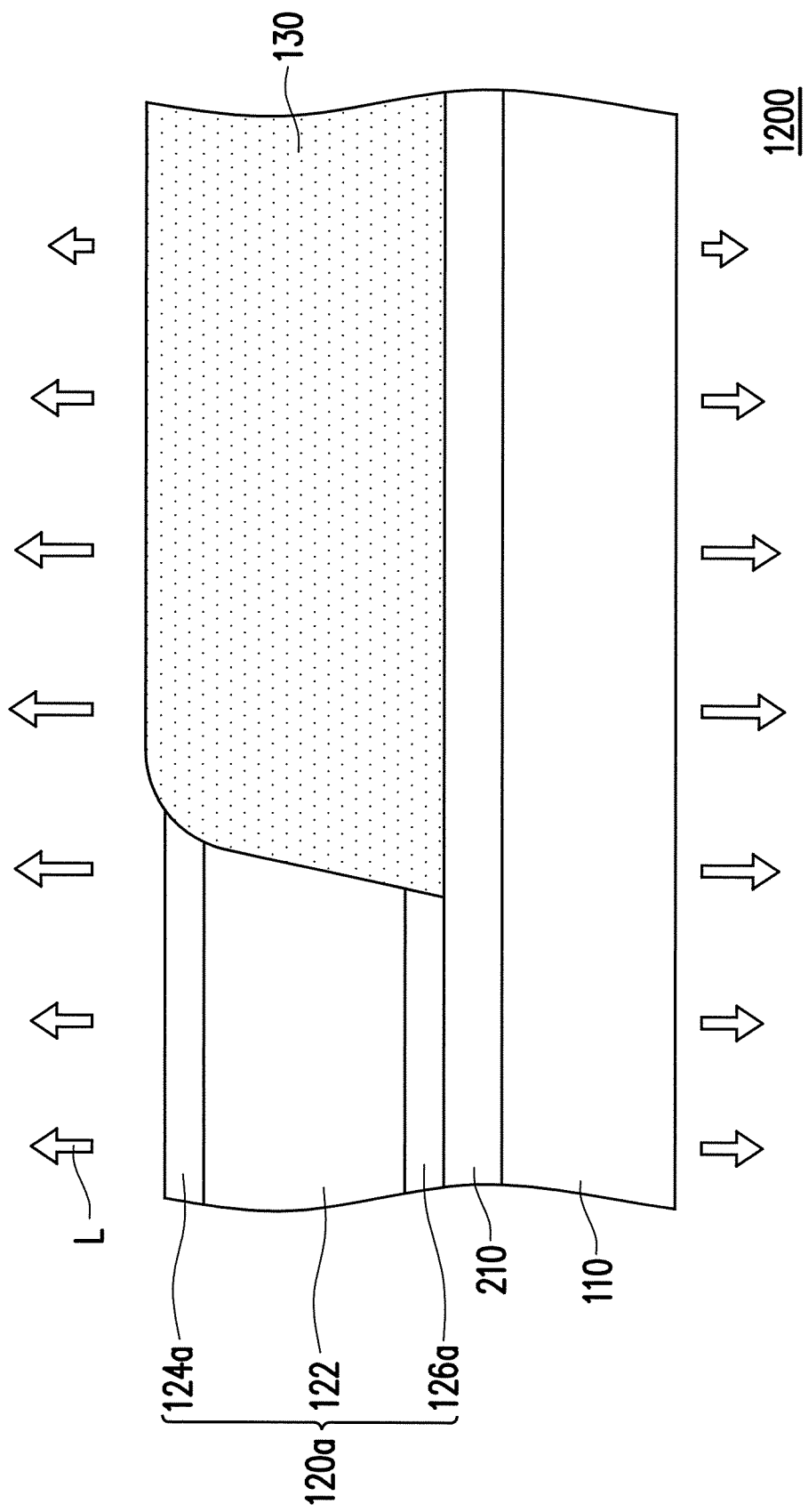
FIG. 15 is a schematic cross-sectional view illustrating a light-emitting apparatus according to an embodiment of the disclosure.

FIG. 15 is a schematic cross-sectional view illustrating a light-emitting apparatus according to an embodiment of the disclosure. Referring to FIG. 15, a light-emitting apparatus 1200 of the embodiment may include one or more of the aforementioned four light output structures. Hence, detailed descriptions in this regard will not be repeated in the following. The light-emitting apparatus 1200 is substantially similar to the light-emitting apparatus 600, and a main difference is that the light-emitting apparatus 1200 further includes a refraction-differing transparent layer 210 having a refractive index different from the refractive indices of the light-emitting device 120a and the light-guiding structure 130. The refraction-differing transparent layer 210 is disposed between the light-guiding structure 130 and the substrate 110. The refraction-differing transparent layer 210 serves to modulate an energy distribution and energy sizes from the two surfaces of the light-emitting apparatus 1200. When the refractive index of the refraction-differing transparent layer 210 is lower than the refractive index of the light-emitting device 120a and the refractive index of the light-guiding structure 130, it is easier to emit the light L from the surface away from the substrate 110. When the refractive index of the refraction-differing transparent layer 210 is higher than the refractive index of the light-emitting device 120a and the refractive index of the light-guiding structure 130, it is easier to emit the light L from the surface near the substrate 110. Thus, the energy distribution and the energy sizes from the two surfaces of the light-emitting apparatus 1200 may be modulated by controlling the refractive index of the refraction-differing transparent layer 210.

Figure 16:
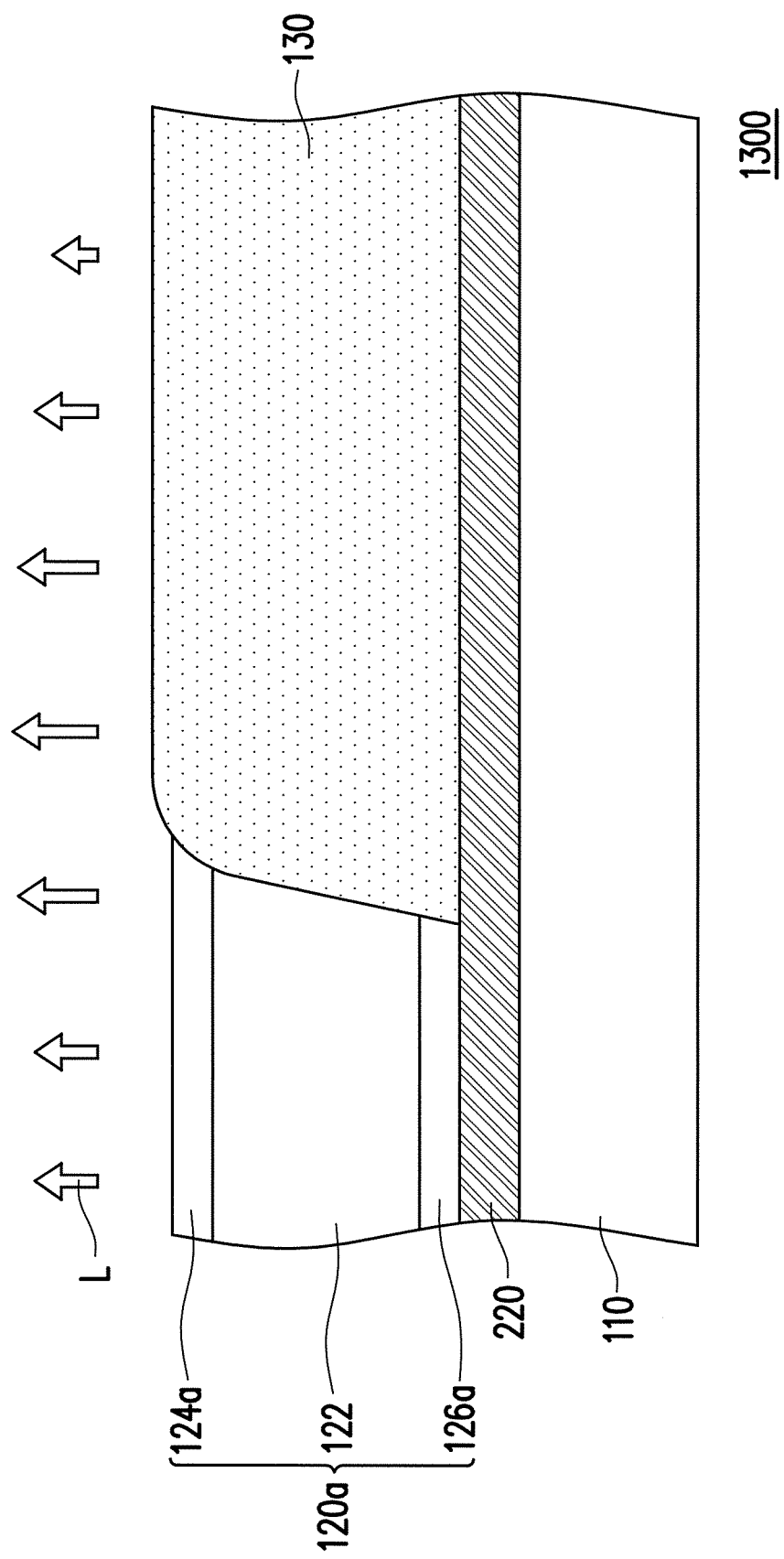
FIG. 16 is a schematic cross-sectional view illustrating a light-emitting apparatus according to an embodiment of the disclosure.

FIG. 16 is a schematic cross-sectional view illustrating a light-emitting apparatus according to an embodiment of the disclosure. Referring to FIG. 16, a light-emitting apparatus 1300 of the embodiment may include one or more of the aforementioned four light output structures. Hence, detailed descriptions in this regard will not be repeated in the following. The light-emitting apparatus 1300 is substantially similar to the light-emitting apparatus 600, and a main difference is that the light-emitting apparatus 1300 further includes an optical film 220. The optical film 220 is disposed between the light-guiding structure 130 and the substrate 110. In addition, the optical film 220 includes an absorption layer, a reflective layer, or a distributed Bragg reflector. With the optical film 220, the light L is only output from the surface of the light-emitting apparatus 1300 away from the substrate 110.

Figure 17:
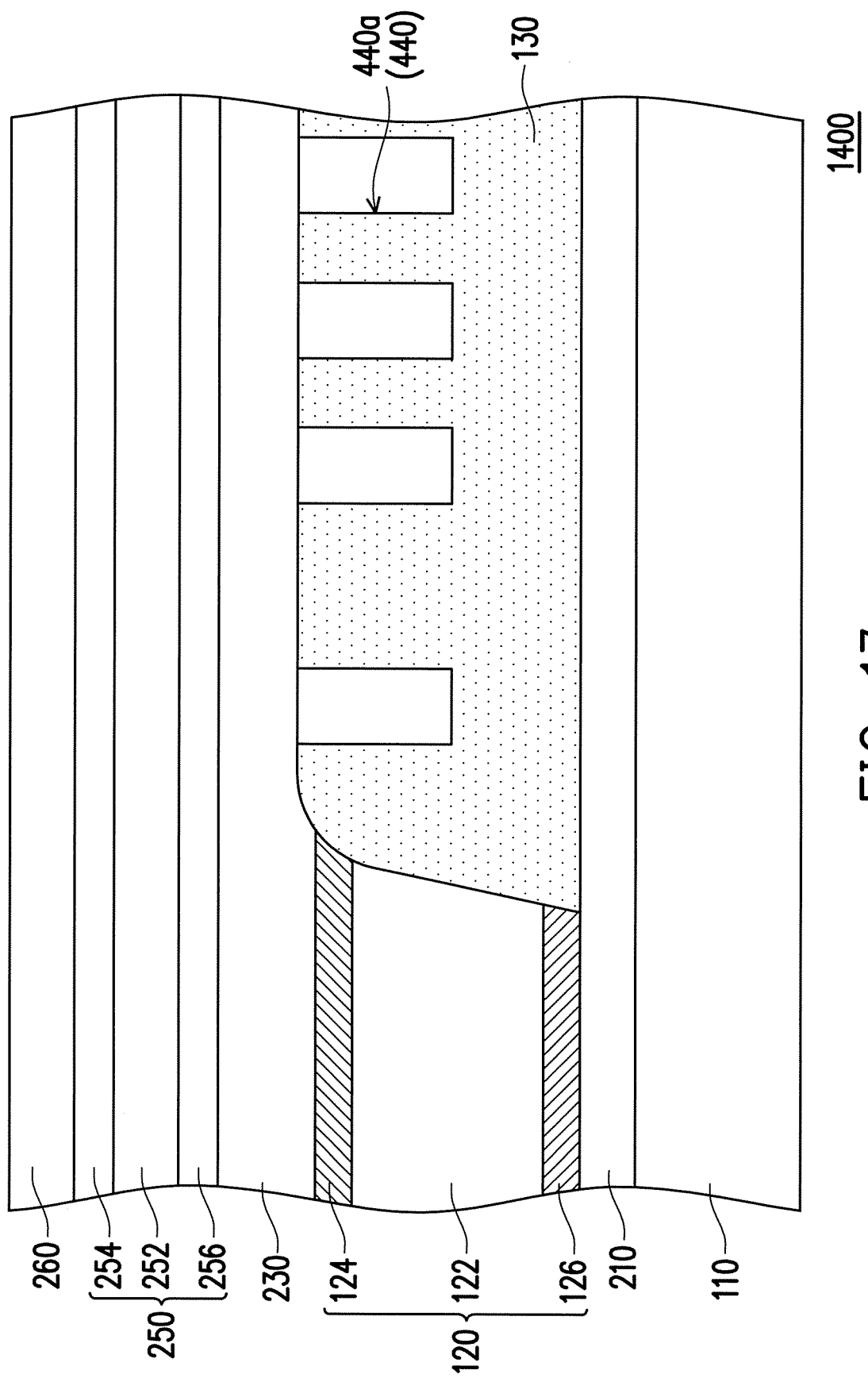
FIG. 17 is a schematic cross-sectional view illustrating a light-emitting apparatus according to an embodiment of the disclosure.

FIG. 17 is a schematic cross-sectional view illustrating a light-emitting apparatus according to an embodiment of the disclosure. Referring to FIG. 17, it should be noted that like or similar components are referred to by like or similar reference symbols, and the descriptions of like or similar components may be referred to the foregoing embodiments and are thus not repeated in the following. A light-emitting apparatus 1400 of the embodiment further includes a thin film encapsulation layer 230, a color saturation gaining structure 250, and a cover 260 sequentially disposed in a bottom-up manner on the light-guiding structure 130 and the light-emitting device 120. The color saturation gaining structure 250 includes a spacer 252, a first reflective structure 254 and a second reflective structure 256. The color saturation gaining structure 250 is a Fabry-Perot structure, for example, capable of purifying a color of the light output by the light-emitting apparatus 1400 and facilitating color saturation. Besides, the first reflective structure 254 and the second reflective structure 256 of the color saturation gaining structure 250 may respectively serve as a driving circuit (Tx) layer as well as a sensing circuit (Rx) layer of a touch sensor. In the embodiments, the spacer 252 has dual functions. On the one hand, the spacer 252 may serve as an insulator layer or a capacitor layer between a driving circuit (Tx) layer and a sensing circuit (Rx) layer of a touch sensor. On the other hand, the spacer 252 may serve as an optical resonant cavity for gaining color saturation and reducing the full width at half maximum of a luminescence spectrum. The material of the spacer 252 may be silicon oxide ($SiO_x$), silicon nitride ($SiN_x$), or other suitable transparent insulating materials. A thickness of the spacer 252 is an integer number of times of one-fourth of a wavelength of the luminescence spectrum, for example. If the luminescence spectrum includes light with a plurality of wavelengths (such as light in the three primary colors (RGB)), a thickness of the spacer 252 is a common multiple of integer numbers of times of one-fourth of wavelengths of all the colors of light for which gaining is to be carried out. For example, if the wavelengths of the colors of light for which gaining is to be carried out are respectively a and b, the thickness of the spacer 252 may be a common multiple of a integer number of times of a/4 and a integer number of times of b/4.

In other embodiments, the spacer 252 may also be a conductive layer configured as an electrode at one side or a bridging layer of a touch sensor. The material of the spacer 252 may be indium tin oxide (ITO), indium zinc oxide (IZO), or other suitable transparent conductive material, for example.

In view of the foregoing, the light-emitting apparatus according to the embodiments of the disclosure include the light-emitting device, the light-guiding structure, and the light output structure. Since the refractive index of the light-guiding structure is greater than or equal to the average refractive index of the light-emitting device, the light-guiding structure is able to more effectively guide the light out of the light-emitting device and disperse the light into the light output structure. Besides, the light limited to the waveguide mode is guided out of the light-emitting apparatus by the light output structure. Accordingly, the light-emitting apparatus according to the embodiments of the disclosure is able to facilitate the light output efficiency.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light-emitting apparatus, comprising:
   a light-emitting device, comprising a plurality of layers, wherein the plurality of layers comprises a light-emitting layer being transparent;
   a light-guiding structure, being transparent, and configured to guide light emitted from the light-emitting layer, wherein the light-guiding structure is disposed beside the light-emitting device, and a refractive index of the light-guiding structure is greater than or equal to an average of refractive indices of the layers of the light-emitting device that is transparent; and
   a light output structure, configured to receive the light guided by the light-guiding structure and output the light out of the light-emitting apparatus, wherein the light-guiding structure is disposed between the light-emitting device and the light output structure.

2. The light-emitting apparatus as claimed in claim 1, wherein the refractive index of the light-guiding structure is greater than or equal to 1.6 and is less than or equal to 2.5.

3. The light-emitting apparatus as claimed in claim 1, wherein the light output structure comprises a reflective structure.

4. The light-emitting apparatus as claimed in claim 1, wherein the light output structure is disposed in the light-guiding structure.

5. The light-emitting apparatus as claimed in claim 4, wherein the light output structure comprises a plurality of scattering particles.

6. The light-emitting apparatus as claimed in claim 4, wherein the light output structure comprises a plurality of refraction structures.

7. The light-emitting apparatus as claimed in claim 6, wherein the refraction structures include air or a material whose refractive index is lower than the refractive index of the light-guiding structure.

8. The light-emitting apparatus as claimed in claim 1, wherein the light output structure comprises a groove disposed on a first surface of the light-guiding structure.

9. The light-emitting apparatus as claimed in claim 8, wherein a distance between a bottom of the groove and a second surface of the light-guiding structure opposite to the first surface is less than $$\frac{\lambda}{2n},$$

wherein λ represents a wavelength of the light, and n represents the refractive index of the light-guiding structure.

10. The light-emitting apparatus as claimed in claim 1, further comprising a substrate, wherein the light-emitting device comprises a light-emitting stacked structure, a first electrode, and a second electrode, the light-emitting stacked structure comprises the light-emitting layer, the first electrode and the second electrode are respectively electrically connected to the light-emitting layer and disposed between the light-emitting stacked structure and the substrate, and the first electrode and the second electrode are separated from each other to expose a portion of a surface of the light-emitting stacked structure.

11. The light-emitting apparatus as claimed in claim 1, further comprising a substrate, wherein the light-emitting device comprises a light-emitting stacked structure, a first electrode, and a second electrode; the light-emitting stacked structure comprises the light-emitting layer; the first electrode and the second electrode are respectively electrically connected to the light-emitting layer; the first electrode is disposed on the light-emitting stacked structure; and the second electrode is disposed between the light-emitting stacked structure and the substrate.

12. The light-emitting apparatus as claimed in claim 11, wherein the first electrode is a transparent electrode, a semi-transparent electrode, or a reflective electrode that is not pervious to light.

13. The light-emitting apparatus as claimed in claim 11, wherein the second electrode is a transparent electrode or a reflective electrode that is not pervious to light.

14. The light-emitting apparatus as claimed in claim 11, wherein the second electrode is reflective mirror that is not pervious to light.

15. The light-emitting apparatus as claimed in claim 11, wherein the second electrode is a distributed Bragg reflector or a wavelength-selective reflector.

16. The light-emitting apparatus as claimed in claim 11, wherein the light-emitting device further comprises a low refractive index layer whose refractive index is lower than a refractive index of the light-emitting stacked structure, and the low refractive index layer is disposed between the second electrode and the light-emitting stacked structure.

17. The light-emitting apparatus as claimed in claim 1, further comprising a substrate and a refraction-differing transparent layer whose refractive index is different from the refractive index indices of the layers of the light-emitting device that is transparent and the refractive index of the light-guiding structure, wherein the refraction-differing transparent layer is disposed between the light-guiding structure and the substrate.

18. The light-emitting apparatus as claimed in claim 1, further comprising a substrate and an optical film, wherein the optical film is disposed between the light-guiding structure and the substrate, and the optical film comprises an absorption layer, a reflective layer, or a distributed Bragg reflector.

19. The light-emitting apparatus as claimed in claim 1, further comprising a thin film encapsulation layer or a color saturation gaining structure disposed on the light-guiding structure and the light-emitting device, wherein the thin film encapsulation layer is configured to encapsulate the light emitting device and the light-guiding structure, and the color saturation gaining structure is configured to purify a color of the light output out of the light-emitting apparatus and to facilitate color saturation.

20. The light-emitting apparatus as claimed in claim 1, further comprising a substrate and a planar layer, wherein the planar layer is disposed between the light-guiding structure and the substrate.

\* \* \* \* \*